United States Patent
Kang

(10) Patent No.: US 6,944,092 B2
(45) Date of Patent: Sep. 13, 2005

(54) SEMICONDUCTOR MEMORY DEVICE

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 33 days.

(21) Appl. No.: 10/730,985

(22) Filed: Dec. 10, 2003

(65) Prior Publication Data
US 2004/0196725 A1 Oct. 7, 2004

(30) Foreign Application Priority Data
Apr. 2, 2003 (KR) ................................. 10-2003-0020768

(51) Int. Cl.[7] ................................................ G11C 8/00
(52) U.S. Cl. .................................. 365/233; 365/189.05
(58) Field of Search .......................... 365/233, 189.05, 365/226, 230.03

(56) References Cited

U.S. PATENT DOCUMENTS

| 5,812,491 A | * | 9/1998 | Shinozaki et al. ........... 365/233 |
| 5,973,988 A | * | 10/1999 | Nakahira et al. ...... 365/230.08 |
| 6,067,244 A | | 5/2000 | Ma et al. |
| 6,104,668 A | * | 8/2000 | Lee et al. ................... 365/233 |
| 6,272,594 B1 | | 8/2001 | Gupta et al. |
| 6,301,145 B1 | | 10/2001 | Nishihara |
| 6,314,016 B1 | | 11/2001 | Takasu |
| 6,327,175 B1 | * | 12/2001 | Manapat et al. ............ 365/154 |
| 6,363,439 B1 | | 3/2002 | Battles et al. |
| 6,434,661 B1 | * | 8/2002 | Konishi et al. ............. 711/105 |
| 6,845,055 B1 | * | 1/2005 | Koga et al. ................. 365/229 |

FOREIGN PATENT DOCUMENTS

KR    1020040059009 A    7/2004

* cited by examiner

Primary Examiner—Anh Phung
(74) Attorney, Agent, or Firm—Heller Ehrman LLP

(57) ABSTRACT

A semiconductor memory device features a nonvolatile ferroelectric mode register. In the semiconductor memory device, a reset process of the mode register is not required in a power-up mode. Additionally, the semiconductor memory device comprising a nonvolatile ferroelectric mode register can perform the same operation as that of SDR (Single Data Rate) SDRAM (Synchronous Dynamic Random Access Memory) or DDR (Double Data Rate) SDRAM. Accordingly, in the semiconductor memory device, data stored in the mode register can be maintained in a power-off state, and the compatibility with DRAM can be obtained.

31 Claims, 24 Drawing Sheets

SEMICONDUCTOR MEMORY DEVICE

BACKGROUND OF THE INVENTION

1. Field of the Invention

The present invention generally relates to a semiconductor memory device, and more specifically, to a technology of setting a mode register using a nonvolatile ferroelectric register so that data stored in the mode register may be maintained even when power is off.

2. Description of the Prior Art

Generally, a ferroelectric random access memory (hereinafter, referred to as 'FRAM') has attracted considerable attention as next generation memory device because it has a data processing speed as fast as a Dynamic Random Access Memory DRAM and conserves data even after the power is turned off.

The FRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FRAM are disclosed in the Korean Patent Application No. 2002-85533 by the same inventor of the present invention. Therefore, the basic structure and the operation on the FRAM are not described herein.

FIGS. 1 and 2 are diagrams illustrating the mode register setup process in a conventional semiconductor memory device.

In the conventional semiconductor memory device, if power is supplied to a chip and a power-up operation is completed (S1), clock signals CLK and /CLK are generated. Then, if the clock signals CLK and /CLK are enabled, volatile data are set in a mode register in response to a command signal (S2). Then, an active, write or read command is performed in response to data set in the mode register (S3). If power is re-supplied in a power-down state (S4), the mode register setting process is performed again.

FIG. 3 is a diagram of a volatile mode register 2 in the conventional semiconductor memory device.

The conventional mode register 2 stores volatile data on chip setting condition in each data region. That is, the mode register 2 sets a burst length, a burst type, a column address strobe latency, a test mode and a DLL (delay-locked loop) in each data region depending on addresses A0~A14 applied from an address bus 1.

Here, the burst length is a unit to consecutively read and write various data at one time, and set as 1,2,4,8 or a full page. The burst type changes addresses with a sequential or interleave type when addresses are changed by the burst length.

The column address strobe latency represents in which clock data can be outputted after the read command. Here, the value of the column address strobe latency becomes 0 in the write mode. The test mode stores information on variables necessary for test. The DLL stores information on variables used when delay time is set.

However, in the conventional mode register 2, data stored in the mode register 2 are required to be reset whenever power is supplied to a system. As a result, the performance of the system is degraded, and the control of a chip is difficult.

Meanwhile, as the operation speed of a semiconductor memory device comprising the volatile mode register 2 increases gradually, noise reflection signals are generated in a transmission process of bus signals. To improve a characteristic of transmission signals by absorbing noise reflection signals, termination resistors are added to each bus.

The termination resistor is generally installed in a bus of an external board of a chip. As a result, the area of the board increases by configuration of extra termination circuits, and current may be leaked through termination resistors in a power-down mode.

SUMMARY OF THE INVENTION

Accordingly, it is an object of the present invention to provide a mode reset register comprising a nonvolatile ferroelectric capacitor so that the mode register may have a nonvolatile characteristic, and more specifically, to perform the same operation as that of SDR (Single Data Rate) SDRAM and DDR (Double Data Rate) SDRAM by applying a nonvolatile ferroelectric capacitor to a mode register.

It is another object of the present invention to provide a semiconductor memory device comprising a switching means for selecting multiple addresses to maintain compatibility with SRAM/flash.

It is still another object of the present invention to improve a transmission characteristic of signals by locating on-chip termination circuits comprised in an on-chip.

In an embodiment, a semiconductor memory device comprises an input buffer, an address latch, a nonvolatile ferroelectric mode register and a bank array. The input buffer detects a logic level of an address inputted by using a reference voltage. The address latch latches an address outputted from the input buffer, and sequentially outputs a bank selecting signal, a row address and a column address. The nonvolatile ferroelectric mode register programs parameters on a chip operation in a nonvolatile ferroelectric capacitor, and outputs a control signal to control a synchronization operation of a cell array depending on a programmed code. The bank array which comprises a plurality of cell arrays controls read/write operations of one cell array synchronously with respect to the control signal in response to the bank selecting signal, the row address and the column address.

In another embodiment, a semiconductor memory device comprises an address latch, a nonvolatile ferroelectric mode register and a bank array. The address latch latches an inputted address, and outputs a bank selecting signal, a row address and a column address sequentially. The nonvolatile ferroelectric mode register programs parameters on a chip operation in a nonvolatile ferroelectric capacitor, and outputs a control signal to control a synchronization operation of a cell array depending on the programmed code. The bank array which comprises a plurality of cell arrays controls read/write operations of one cell array synchronously with respect to the control signal in response to the bank selecting signal, the row address and the column address.

In still another embodiment, a semiconductor memory device comprises a nonvolatile ferroelectric mode register and a bank array. The nonvolatile ferroelectric mode register which comprises a nonvolatile ferroelectric memory outputs a control signal to control a synchronization operation of a cell array depending on a programmed mode register value in the nonvolatile ferroelectric memory. The bank array which comprises a plurality of cell arrays performs read/write operations of the selected cell array synchronously with respect to the control signal.

DETAILED DESCRIPTION OF THE PREFERRED EMBODIMENTS

The present invention will be described in detail with reference to the accompanying drawings.

Figure 1:
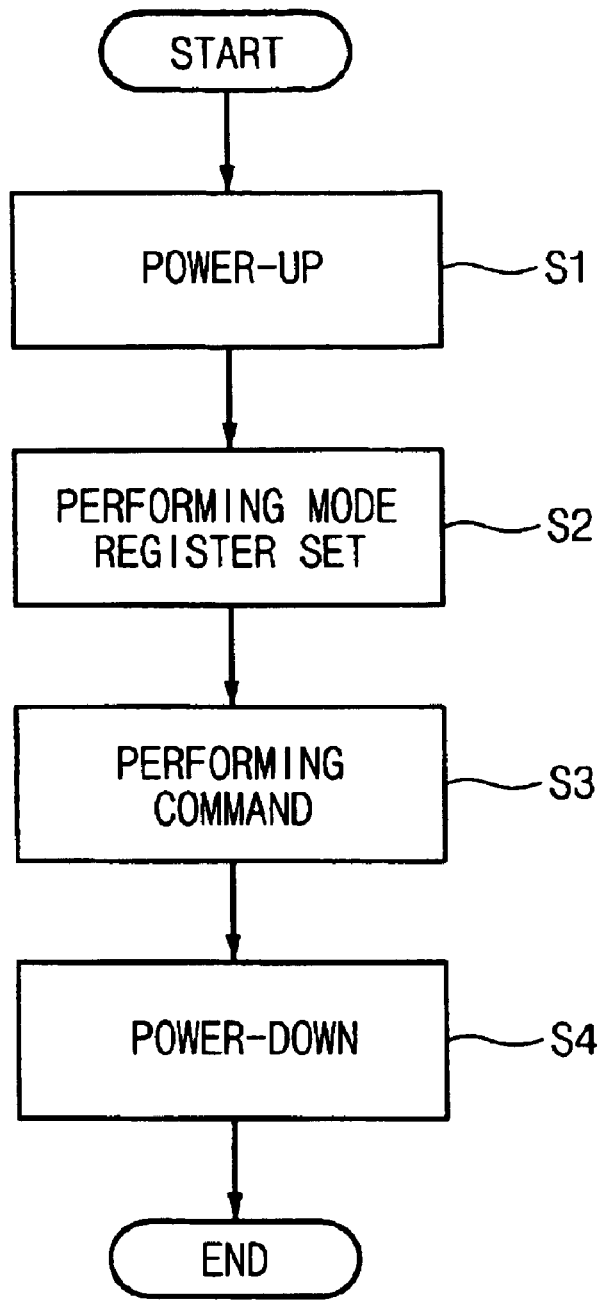
FIG. 1 is a diagram illustrating the mode register setup process in a conventional memory device.
Figure 2:
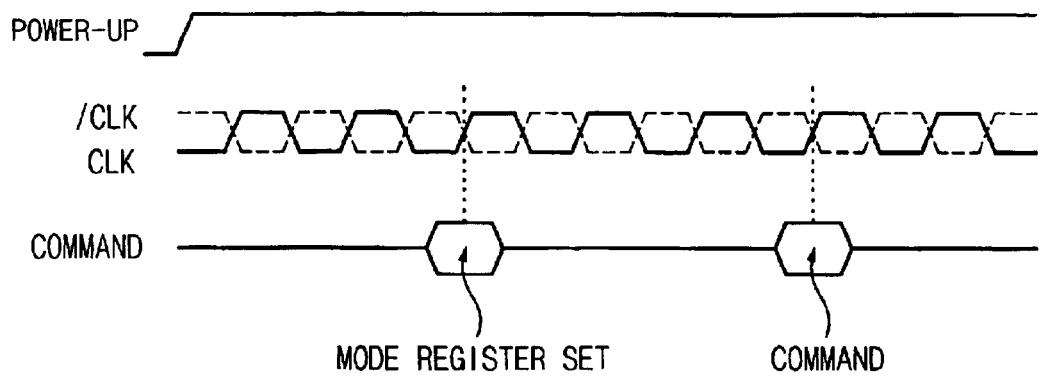
FIG. 2 is a timing diagram of the mode register set in the conventional semiconductor memory device.
Figure 3:
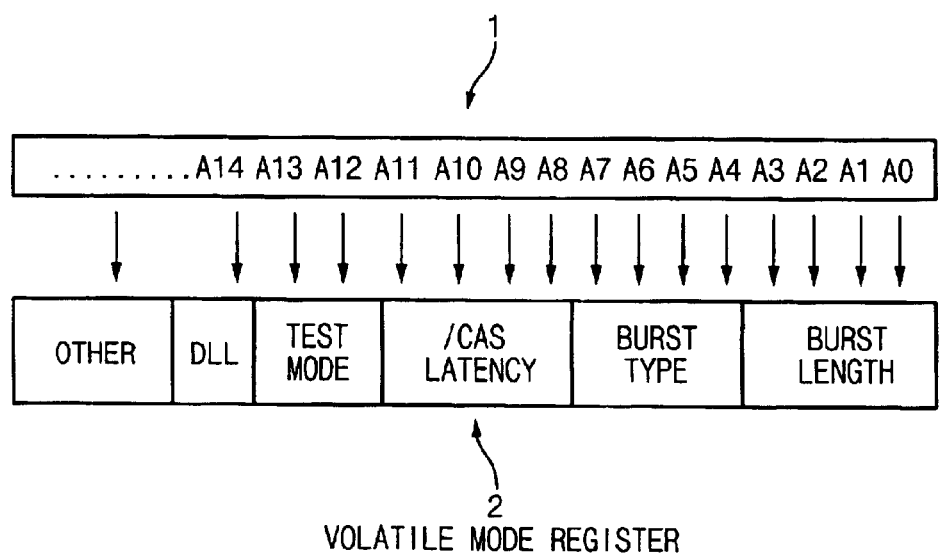
FIG. 3 is a diagram of a volatile mode register in the conventional semiconductor device.
Figure 4:
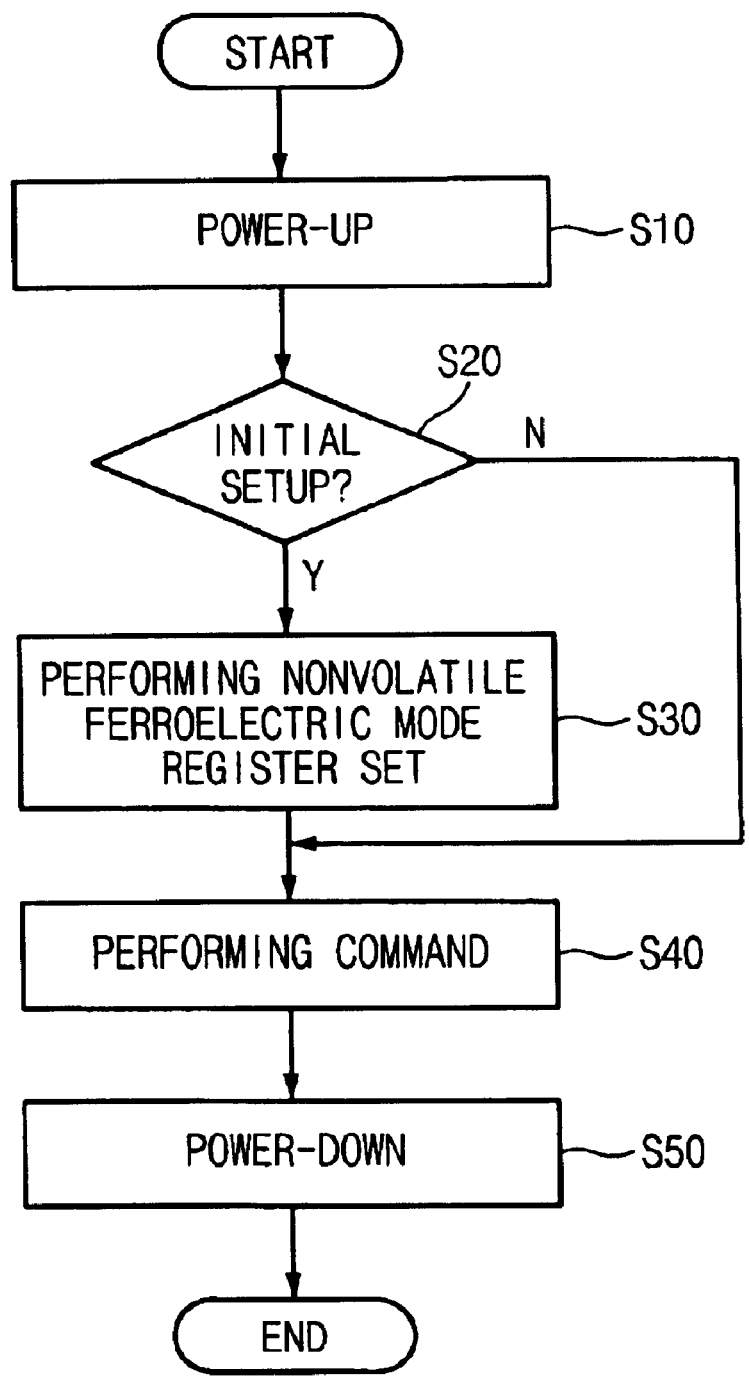
FIG. 4 is a diagram illustrating the mode register setup process of a semiconductor memory device according to an embodiment of the present invention.
Figure 5:
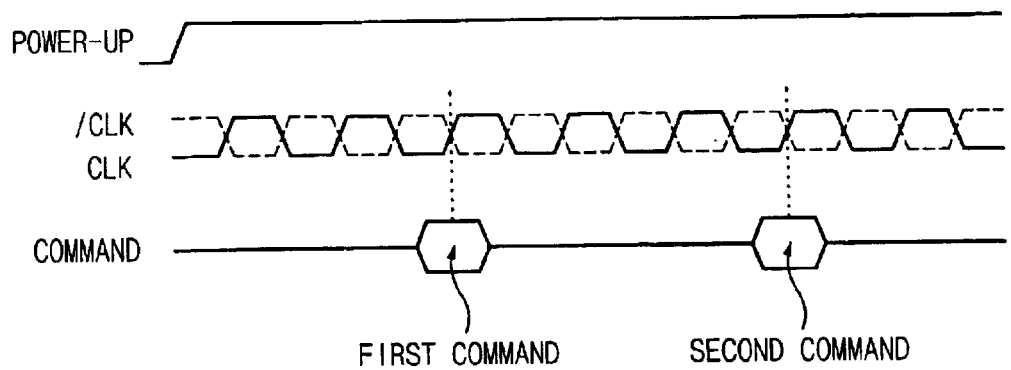
FIG. 5 is a diagram illustrating command performance timing of a semiconductor memory device according to an embodiment of the present invention.

FIGS. 4 and 5 are diagrams illustrating the mode register setup process of a semiconductor memory device according to an embodiment of the present invention.

If power is supplied to a chip and a power-up operation is completed (S10), clock signals CLK and /CLK are generated. Here, in an embodiment of the present invention, the system judges whether its operation is in an initial setup process (S20), a system sets nonvolatile data in a nonvolatile ferroelectric mode register upon the power-up mode if it is at an initial setup state. A mode register setup operation is performed through a CMOS setup process after a chip test process or after installment of a semiconductor memory device in the system (S30).

The clock signals CLK and /CLK are enabled, an active, write or read command is performed in response to non-volatile data set in a nonvolatile ferroelectric mode register (S40). When power is supplied again after completion of the power-down mode (S50), a command is performed immediately without a mode register setting process.

Figure 6:
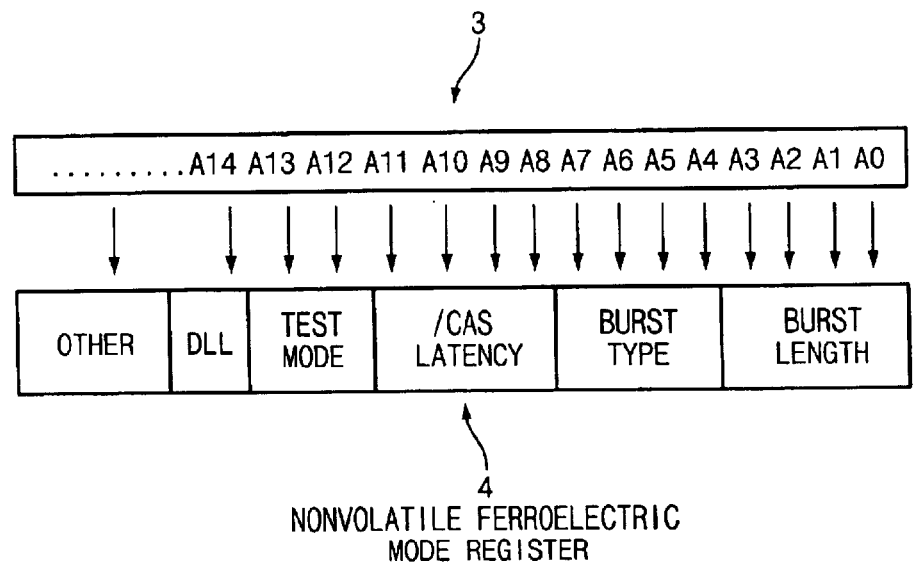
FIG. 6 is a diagram of a nonvolatile ferroelectric mode register of a semiconductor memory device according to an embodiment of the present invention.

FIG. 6 is a diagram of a nonvolatile ferroelectric mode register 4 of a semiconductor memory device according to an embodiment of the present invention.

In an embodiment, the nonvolatile ferroelectric mode register 4 stores nonvolatile data on chip setting condition in each data region. The nonvolatile ferroelectric mode register 4 sets nonvolatile data on a burst length, a burst type, a /column address strobe latency, a test mode and a DLL (delay-locked loop) in each data region depending on addresses A0~A14 applied from an address bus 3. Here, the nonvolatile ferroelectric mode register 4 stores parameters with nonvolatile data so that the data may be maintained when power is off.

Figure 7:
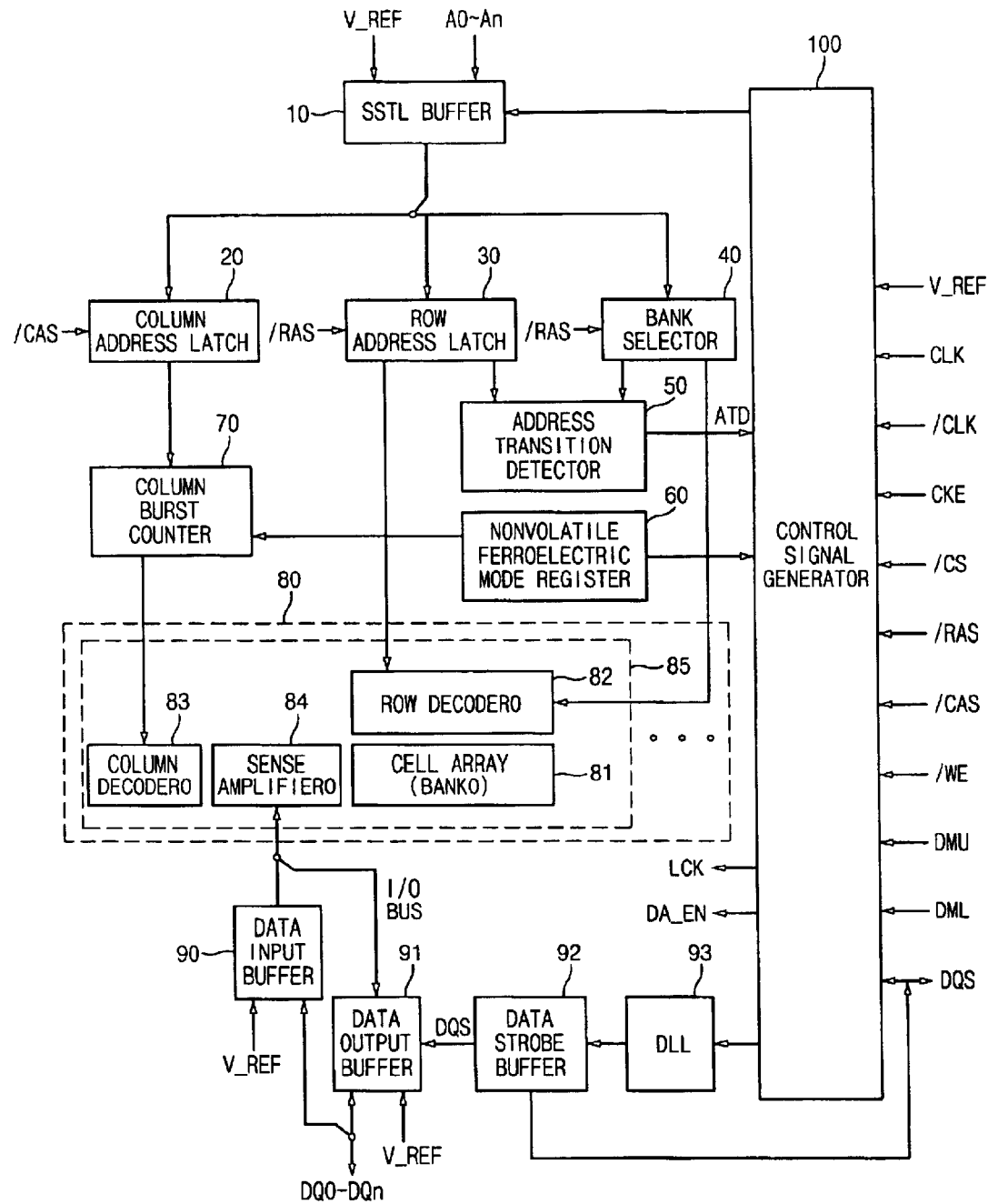
FIGS. 7 and 8 are diagrams illustrating examples to embody a DDR (Double Data Rate) operation of a semiconductor memory device according to an embodiment of the present invention.

FIG. 7 is a diagram illustrating a multiple address nonvolatile ferroelectric memory device to perform the same operation as that of a DDR (Double Data Rate) SDRAM according to an embodiment of the present invention.

In an embodiment, the nonvolatile ferroelectric memory device comprises a SSTL (Stub Series Terminated Transceiver Logic) buffer 10, a column address latch 20, a row address latch 30, a bank selector 40, an address transition detector 50, a nonvolatile ferroelectric mode register 60, a column burst counter 70, a bank array 80, a data input buffer 90, a data output buffer 91, a data strobe buffer 92, a DDL (delay-locked loop) 93 and a control signal generator 100.

Here, the SSTL buffer 10 detects logic levels of addresses A0~An inputted by a reference voltage V_REF inputted externally. Output signals from the SSTL buffer 10 are sequentially outputted into the bank selector 40, the row address latch 30 and the column address latch 20.

The column address latch 20 outputs a column address latched by a /column address strobe signal /CAS into the column burst counter 70. The row address latch 30 outputs a row address latched by a row address strobe signal /RAS into the row decoder 82 and the address transition detector 50. The bank selector 40 outputs a bank selecting signal into the address transition detector 50 and the row decoder 82 in response to the row address strobe signal /RAS.

The address transition detector 50 detects address transition in the latched row address and the bank selecting signal, and outputs an address transition detecting signal ATD into the control signal generator 100. Here, the address transition detecting signal ATD is generated only when the previously selected bank address or row address is changed. However, the address transition detecting signal ATD is not generated when the bank address or row address is not changed, and a sensing operation of cell data is not performed. As a result, an unnecessary destructive operation of cell data is prevented, thereby improving reliability of cell data and reducing driving current of a chip.

As shown in FIG. 6, the nonvolatile ferroelectric mode register 60 stores parameters on chip setting condition in a nonvolatile ferroelectric memory. In a burst mode, the column burst counter 70 counts additional column addresses to increase by using the latched column address from the column address latch 20 as a start address.

The bank array 80 comprises a plurality of banks 85. Each bank 85 comprises a cell array 81, a row decoder 82, a column decoder 83 and a sense amplifier 84.

The row decoder 82 is activated in response to a bank selecting signal, and decodes the latched row address. The column decoder 83 decodes a column address in response to an output signal from the column burst counter 70. The column decoder 83 selectively outputs I/O bus data inputted through the data input buffer 90 into the sense amplifier 84. Also, the column decoder 83 selectively outputs the amplified data in the sense amplifier 84 into the data output buffer 91 through an I/O bus.

The data input buffer 90 compares input data inputted from data input/output pins DQ0~DQn with a reference voltage V_REF, and outputs the comparison result into the I/O bus. The data output buffer 91 outputs data applied from the I/O bus into the input/output pins DQ0~DQn synchronously with respect to a data strobe signal DQS.

The data strobe buffer 92 outputs the data strobe signal DQS into the data output buffer 91 and the control signal generator 100 in response to an output signal from the DLL 93. The DLL 93 is a phase conversion circuit to compensate delay time of an input signal. The DLL 93 outputs a signal of the same waveform having a phase difference synchronously with respect to the synchronization signals CLK and /CLK inputted externally into the data strobe buffer 92.

The control signal generator 100 generates a latch clock signal LCK, a differential amplification enable signal DA_EN and other control signals necessary for chip driving in response to the reference voltage V_REF, the clock signals CLK and /CLK, an activation clock signal CKE, a chip selecting signal /CS, the row address strobe signal /RAS, the column address strobe signal /CAS, a write enable signal /WE, a mask control signals DMU and DML, and the data strobe signal DQS.

The activation clock signal CKE is to control activation of the synchronization clock signals CLK and /CLK. When a command signal is inputted, the chip selecting signal /CS is activated to a low level to select a chip. The row address strobe signal /RAS is to strobe the row address and the bank address. The column address strobe signal /CAS is to strobe the column address. The write enable signal /WE is to read or write data in the cell array 81.

The mask control signals DMU and DML is to mask a write operation of byte data. Here, the mask control signal DMU is to control activation of the write operation of upper byte input/output data. The mask control signal DML is to control activation of the write operation of lower byte input/output data. The data strobe signal DQS as a bilateral control signal is controlled by a master in a write mode and by a slave in a read mode.

Figure 8:
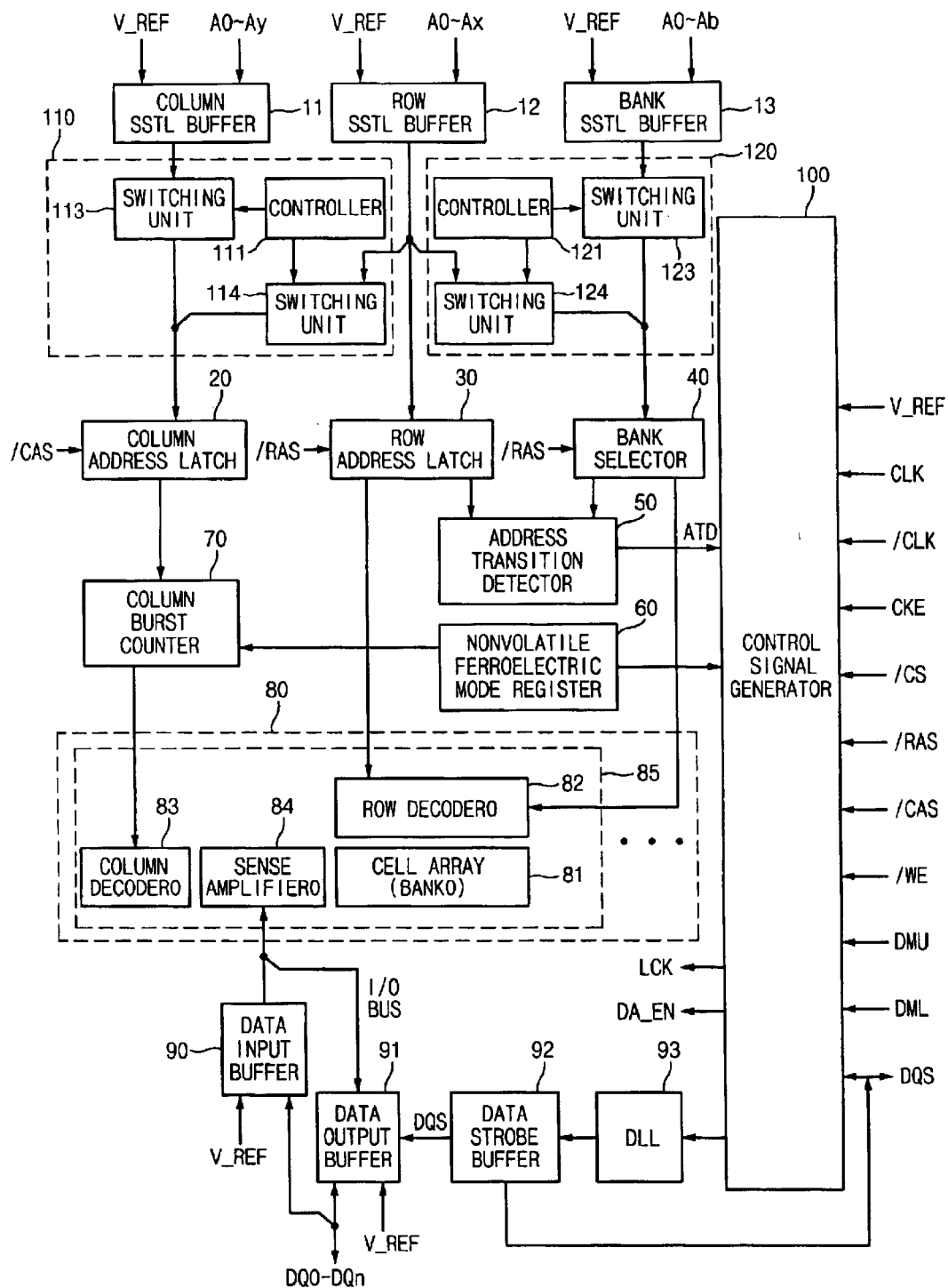

FIG. 8 is a diagram illustrating a multiple address combination nonvolatile ferroelectric memory device to perform the same operation as that of a DDR (Double Data Rate) SDRAM according to an embodiment of the present invention.

In an embodiment of FIG. 8, the nonvolatile ferroelectric memory device comprises the same elements as those of FIG. 7. However, the nonvolatile ferroelectric memory device further comprises switching controllers 110 and 120 so that SSTL input buffers may be selectively used for compatibility with SRAM (Static Random Access Memory) and Flash. The same numerical references as those of FIG. 7 are used in the elements of FIG. 8, and the detailed explanation is omitted.

Specifically, the nonvolatile ferroelectric memory device comprises a column SSTL buffer 11, a row SSTL buffer 12, a bank SSTL buffer 13, a switching controller 110, a switching controller 120, a column address latch 20, a row address latch 30, a bank selector 40, an address transition detector 50, a nonvolatile ferroelectric mode register 60, a column burst counter 70, a bank array 80, a data input buffer 90, a data output buffer 91, a data strobe buffer 92, a DLL (delay-locked loop) 93 and a control signal generator 100.

The switching controller 110 comprises a controller 111, a switching unit 113, a switching unit 114 having an opposite phase to the switching unit 113. The switching controller 120 comprises a controller 121, a switching unit 123 and a switching unit 124 having an opposite phase to the switching unit 123.

The column SSTL buffer 11 detects logic levels of column addresses A0~Ay inputted by the reference voltage V_REF inputted externally. The row SSTL buffer 12 detects logic levels of row addresses A0~Ax inputted by the reference voltage V_REF inputted externally. The bank SSTL buffer 13 detects logic levels of bank addresses A0~Ab inputted by the reference voltage V_REF inputted externally.

An output signal from the column SSTL buffer 11 is outputted into the column address latch 20 through the switching controller 110. An output signal from the row SSTL buffer 12 is outputted into the row address latch 30. An output signal from the bank SSTL buffer 13 is outputted into the bank selector 40 through the switching controller 120.

Hereinafter, the operation of the nonvolatile ferroelectric memory device is described.

In a general operation mode, the controller 111 controls the switching unit 113 to be turned on, and the controller 121 controls the switching unit 123 to be turned on. Here, the switching units 114 and 124 are maintained at a turn-off state.

As a result, the output signal from the bank SSTL buffer 13 is outputted into the bank selector 40, and the output signal from the row SSTL buffer 12 is outputted into the row address latch 30. Output signals from the column SSTL buffer 11 are sequentially outputted into the column address latch 20.

On the other hand, in a time-division control mode, the controller 111 controls the switching unit 114 to be turned on, and the controller 121 controls the switching unit 124 to be turned on. Here, the switching units 113 and 123 are maintained at a turn-off state. The bank address, the row address and the column address inputted through the row SSTL buffer 12 are sequentially controlled by a time-division method.

In the above-described embodiments of FIGS. 7 and 8, at least two data are required to be detected during a cycle for a DDR operation. Thus, it is necessary to rapidly detect voltage levels of input data based on the reference voltage for a short interval. For the rapid detection, a SSTL (Stub Series Terminated Transceiver Logic) level is used as a voltage level of input data in the embodiments of FIGS. 7 and 8.

Figure 9:
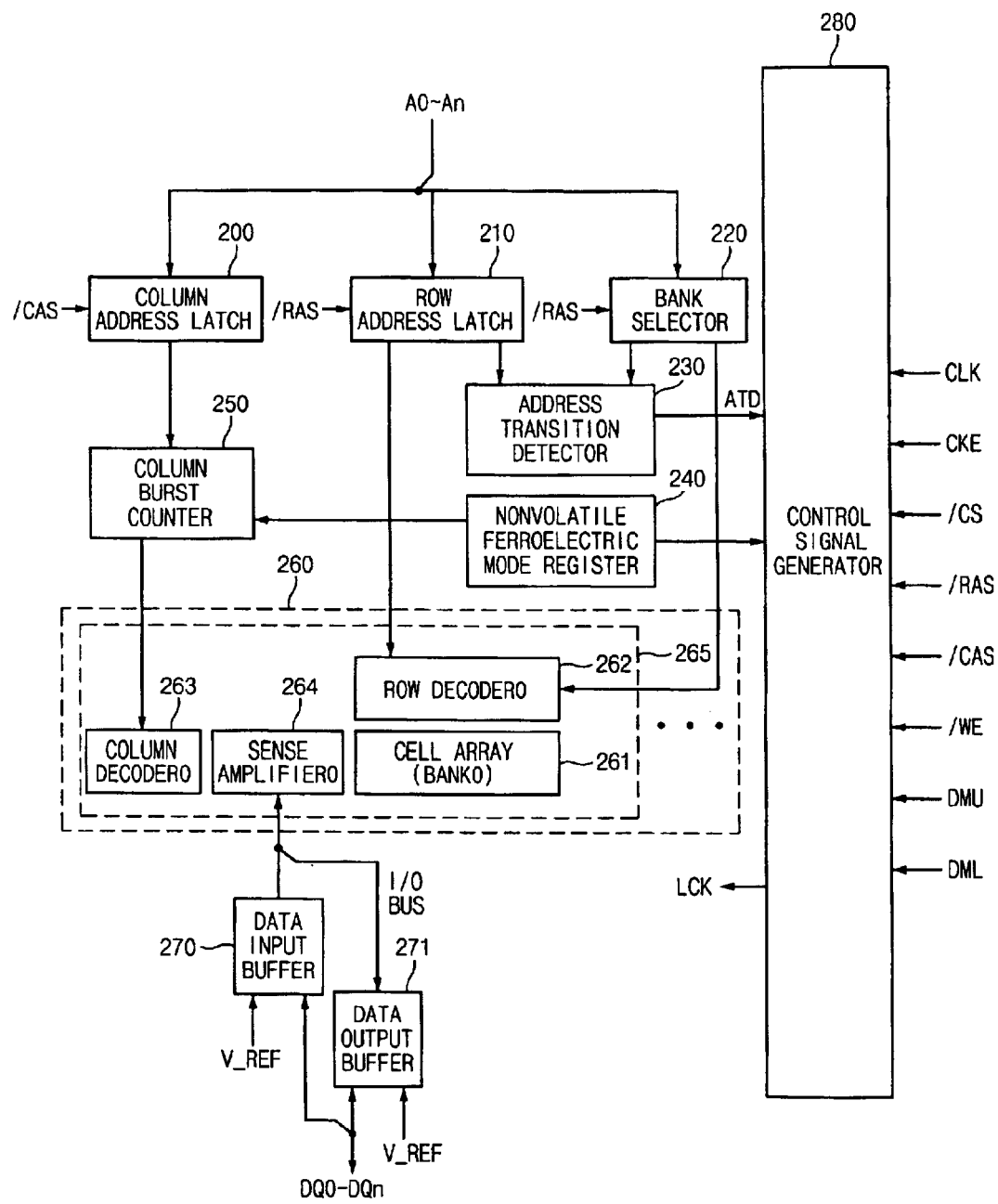
FIGS. 9 and 10 are diagrams illustrating examples to embody a SDR (Single Data Rate) operation of a semiconductor memory device according to an embodiment of the present invention.

FIG. 9 is a diagram illustrating an example of a multiple address nonvolatile ferroelectric memory device to perform the same operation as that of SDR (Single Data Rate) SDRAM according to an embodiment of the present invention.

In an embodiment of FIG. 9, the nonvolatile ferroelectric memory device comprises a column address latch 200, a row address latch 210, a bank selector 220, an address transition detector 230, a nonvolatile ferroelectric mode register 240, a column burst counter 250, a bank array 260, a data input buffer 270, a data output buffer 271 and a control signal generator 280.

The column address latch 200 outputs addresses A0~An inputted by a column address strobe signal /CAS into the column burst counter 250. The row address latch 210 outputs row addresses A0~An inputted by a row address strobe signal /RAS into the row decoder 262 and the address transition detector 230. The bank selector 220 outputs a bank selecting signal into the address transition detector 230 and the row decoder 262 in response to the row address strobe signal /RAS.

The address transition detector 230 outputs an address transition detecting signal ATD generated by transition of a row address and a bank address into the control signal generator 100. Here, the address transition detecting signal ATD is generated only when the previously selected bank address or row address is changed. However, the address transition detecting signal ATD is not generated when a bank address or row address is not changed, and cell data are not sensed. As a result, an unnecessary destructive operation of cell data is prevented, thereby improving reliability of cell data and reducing driving current of a chip.

The nonvolatile ferroelectric mode register 240 stores parameters on chip setting condition in a nonvolatile ferroelectric memory as shown in FIG. 6. In a burst mode, the column burst counter 250 counts an additional column address to increase by using a column address applied from the column address latch 200 as a start address.

The bank array 260 comprises a plurality of banks 265. Each bank 265 comprises a cell array 261, a row decoder 262, a column decoder 263 and a sense amplifier 264.

The row decoder 262 is activated in response to the bank selecting signal, and decodes a row address. The column decoder 263 decodes a column address in response to an output signal from the column bus counter 250. Also, the column decoder 263 selectively outputs I/O bus data inputted through the data input buffer 270 into the sense amplifier 264, and then selectively outputs the amplified data in the sense amplifier 264 into the data output buffer 271 through an I/O bus.

The data input buffer 270 buffers input data inputted from data input/output pins DQ0~DQn, and outputs the buffered data into the I/O bus. The data output buffer 271 buffers data applied from the sense amplifier 264, and outputs the buffered data into the data input/output pins DQ0~DQn.

The control signal generator 280 generates a latch clock signal LCK and other control signals necessary for chip driving in response to a clock signal CLK, an activation clock signal CKE, a chip selecting signal /CS, a row address strobe signal /RAS, a column address strobe signal /CAS, a write enable signal /WE and a mask control signals DMU and DML.

Here, the activation clock signal CKE is to control activation of the synchronization clock signal CLK. When a command is inputted, the chip selecting signal /CS is activated to a low level to select a chip. The row address strobe signal /RAS is to strobe a row address and a bank address. The column address strobe signal /CAS is to strobe a column address. The write enable signal /WE is to read or write data in the cell array 261.

The mask control signals DMU and DML are to mask a write operation of byte data. Here, the mask control signal DMU is to control activation of the write operation of upper byte input/output data. The mask control signal DML is to control activation of the write operation of lower byte input/output data.

Figure 10:
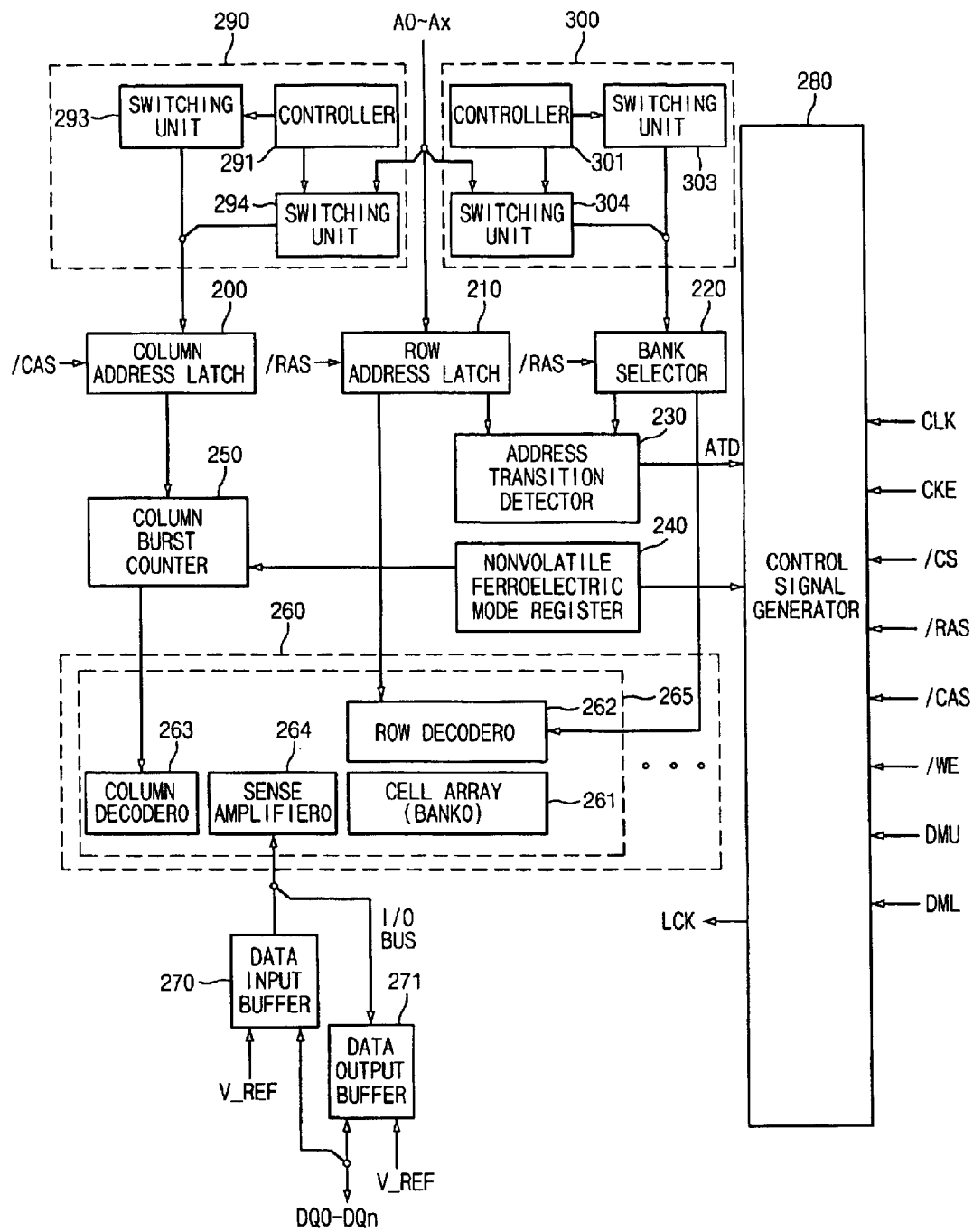

FIG. 10 is a diagram illustrating an example of a multiple address combination nonvolatile ferroelectric memory device to perform the same operation as that of SDR (Single Data Rate) SDRAM according to an embodiment of the present invention.

In an embodiment of FIG. 10, the nonvolatile ferroelectric memory device comprises the same elements as those of FIG. 9. However, the nonvolatile ferroelectric memory device further comprises switching controllers 290 and 300 so that input addresses may be selectively used for compatibility with SRAM (Static Random Access Memory) and Flash. The same numerical references as those of FIG. 9 are used in the elements of FIG. 10, and the detailed explanation is omitted.

In the embodiment of FIG. 10, the nonvolatile ferroelectric memory device comprises a switching controller 290, a switching controller 300, a column address latch 200, a row address latch 210, a bank selector 220, an address transition detector 230, a nonvolatile ferroelectric mode register 240, a column burst counter 250, a bank array 260, a data input buffer 270, a data output buffer 271 and a control signal generator 280.

Here, the switching controller 290 comprises a controller 291, a switching unit 293 and a switching unit 294 having an opposite phase to the switching unit 293. The switching controller 300 comprises a controller 301, a switching unit 303 and a switching unit 304 having an opposite phase to the switching unit 303.

Column addresses A0~Ay are outputted into the column address latch 200 through the switching controller 290, and row addresses A0~Ax are outputted into the row address latch 210. Bank addresses A0~Ab are outputted into the bank selector 220 through the switching controller 300.

Hereinafter, the operation of the nonvolatile ferroelectric memory device of FIG. 10 is described.

In a general operation mode, the controller 291 controls the switching unit 293 to be turned on, and the controller 301 controls the switching unit 303 to be turned on. Here, the switching units 294 and 304 are maintained at a turn-off state.

As a result, the bank addresses A0~Ab are outputted into the bank selector 220, and the row addresses A0~Ax are outputted into the row address latch 210. The column addresses A0~Ay are sequentially outputted into the column address latch 200.

On the other hand, in a time-division control mode, the controller 290 controls the switching unit 294 to be turned on, and the controller 301 controls the switching unit 304 to be turned on. Here, the switching units 293 and 303 are maintained at a turn-off state. The bank address, the row address and the column address inputted through row address A0~Ax input pins are sequentially controlled by a time-division method.

In the above-described embodiments of FIGS. 9 and 10, a level of input data becomes a LVTTL (Low Voltage Transistor Transistor Logic) level for the SDR operation. That is, since one data is outputted during a cycle, the embodiments of FIGS. 9 and 10 can be applied to a chip of a low voltage level.

Figure 11:
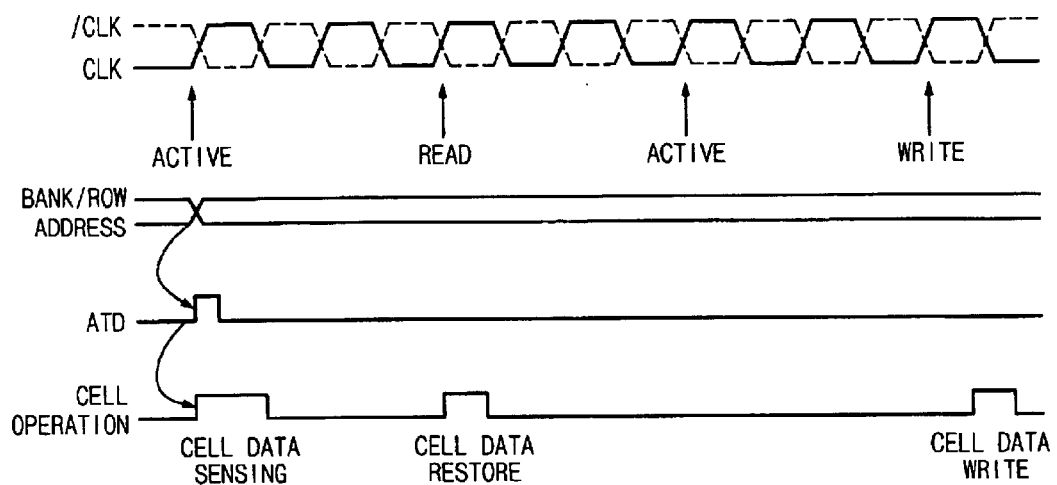
FIGS. 11 and 12 are timing diagrams illustrating the cell operation depending on address transition detection according to an embodiment of the present invention.
Figure 12:
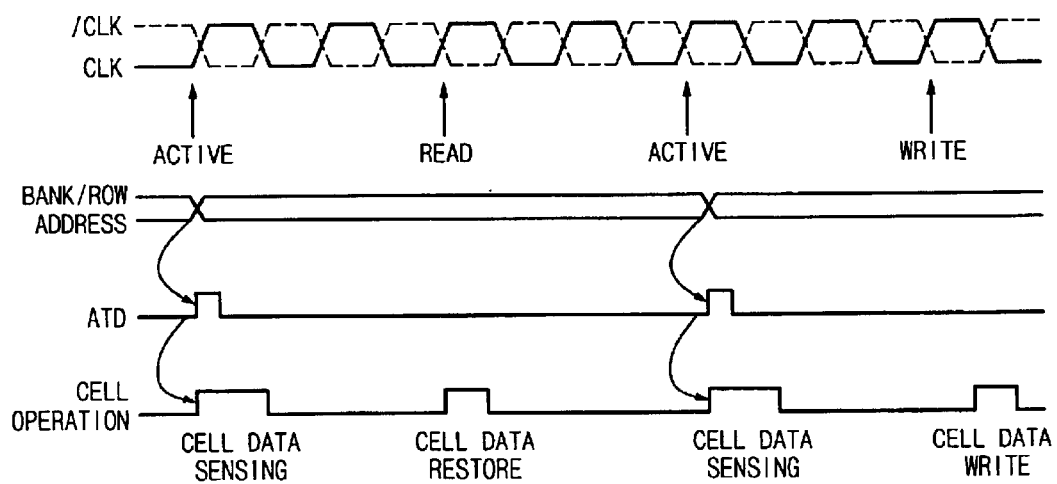

FIGS. 11 and 12 are timing diagrams illustrating the cell operation depending on the address transition detecting signal ATD according to an embodiment of the present invention.

FIG. 11 shows the cell operation when an active command is performed in the same bank address and the row address.

While the active command is performed, the address transition detecting signal ATD is not generated when the inputted bank address and the row address is identical with those of the previous cycle.

AS shown in FIG. 11, when no address transition detecting signal ATD is generated after generation of the initial address transition detecting signal ATD, cell data are restored in response to a read command in the sensing operation of cell data, and the cell data are sequentially written in response to a write command.

FIG. 12 shows the cell operation when an active command is performed after input of a new bank address or row address.

While the active command is performed, the address transition detecting signal ATD is generated when the bank address and the row address are different from those of the previous cycle. As shown in FIG. 12, new cell data are required to be sensed synchronously with respect to the active command whenever the address transition detecting signal ATD.

After a bitline is precharged to a low level in the sensing operation of cell data, a high pulse is applied to a wordline and a plateline so that the cell data may perform a destructive operation. Then, the destroyed cell data are sensed and amplified by the sense amplifier, and then stored in the sense amplifier. The amplified data serves as a page buffer.

In this state, a restore or write operation is performed in response to a read or write command. Here, when the active operation is repeated in the same row address, the address transition detecting signal ATD is controlled to prevent the repeated destructive operation resulting from the cell data sensing process. AS a result, the sensing operation of cell data is performed only when the address transition detecting signal ATD is enabled, thereby preventing power consumption by unnecessary cell data sensing operation.

Figure 13:
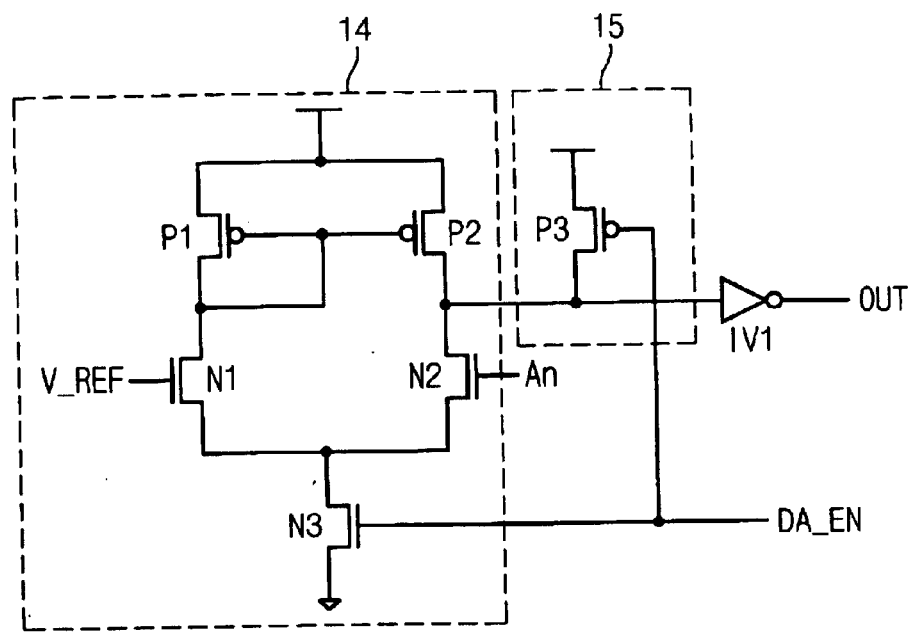
FIG. 13 is a circuit diagram of an input buffer according to an embodiment of the present invention.

FIG. 13 is a circuit diagram of an input buffer applied to the SSTL buffer 10, the column SSTL buffer 11, the row SSTL buffer 12 and the bank SSTL buffer 13 of FIGS. 7 and 8.

Hereinafter, the SSTL buffer 10, the column SSTL buffer 11, the row SSTL buffer 12 and the bank SSTL buffer 13 are referred to as an input buffer. The SSTL buffer 10 of FIG. 7 is exemplified for the input buffer of FIG. 13.

The input buffer comprises a differential amplifier 14, a driver 15 and an inverter IV1.

The differential amplifier 14 comprises PMOS transistor P1 and P2, and NMOS transistors N1~N3. The PMOS transistors P1 and P2 have a common source to receive a power voltage and a common gate connected to a drain of the PMOS transistor P1.

The NMOS transistor N1, connected between the PMOS transistor P1 and the NMOS transistor N3, has a gate to receive the reference voltage V_REF. The NMOS transistor N2, connected between the PMOS transistor P2 and the NMOS transistor N3, has a gate to receive the address An. The NMOS transistor N3, connected between a common source of the NMOS transistors N1 and N2 and a ground voltage terminal, has a gate to receive the differential amplification enable signal DA_EN.

The driver 15 comprises a PMOS transistor P3. The PMOS transistor P3, connected between a power voltage terminal and an output terminal of the differential amplification unit 14, has a gate to receive the differential amplification enable signal DA_EN. The inverter IV1 inverts an output signal from the driver 15 to output an output signal OUT.

The input buffer compares and amplifies a voltage level of the inputted address An with the reference voltage V_REF when the differential amplification enable signal DA_EN is enabled, and outputs the comparison result. When the differential amplification enable signal DA_EN is disabled, the driver 15 is enabled to output a low level voltage as the output signal OUT.

Figure 14:
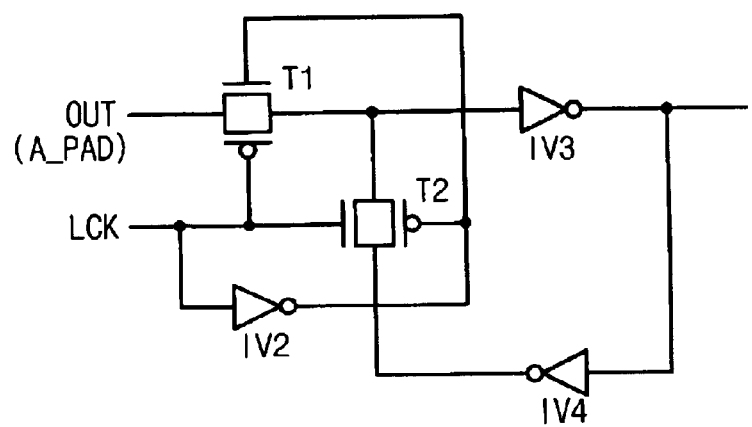
FIG. 14 is a circuit diagram of an address latch according to an embodiment of the present invention.

FIG. 14 is a circuit diagram of an address latch applied to the column address latches 20 and 200, the row address latches 30 and 210 and the bank selector 40 and 220 of FIGS. 7 and 10.

Hereinafter, the column address latches 20 and 200, the row address latches 30 and 210 and the bank selector 40 and 220 are referred to as an address latch.

The address latch comprises transmission gate T1 and T2, and inverters IV2~IV4. The inverter IV2 inverts the latch clock signal LCK applied from the control signal generators 100 and 280. The transmission gate T1 selectively outputs the output signal OUT of the input buffer in response to the latch clock signal LCK. Here, a signal inputted into the address latch is the output signal OUT of the input buffer in the embodiments of FIGS. 7 and 8, and an address A_PAD applied from an input pad in the embodiments of FIGS. 9 and 10. The transmission gate T2 selectively outputs a signal latched by the inverters IV3 and IV4 in response to the latch clock signal LCK.

Figure 15:
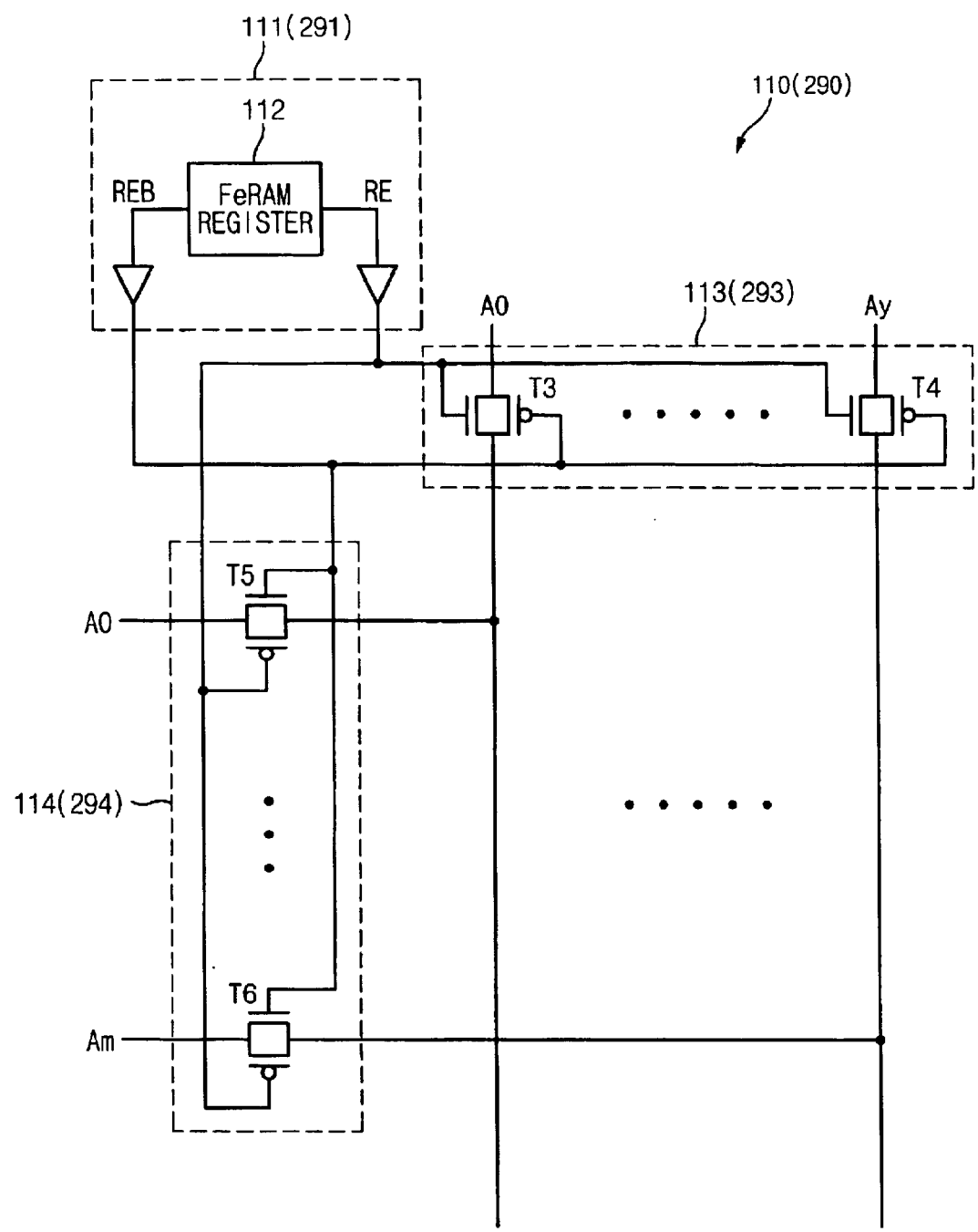
FIGS. 15 and 16 are circuit diagrams of a switching unit according to an embodiment of the present invention.

FIG. 15 is a circuit diagram of a switching unit applied to the switching controllers 110 and 290 of FIGS. 8 and 10. Here, the switching controller 110 of FIG. 8 is exemplified because it has the same structure and operation as those of the switching controller 290 of FIG. 10.

The switching controller 110 comprises the controller 111, and the switching units 113 and 114.

The controller 111 comprises a FeRAM register 112. The FeRAM register 112 sets a selective output operation of the input buffer and a time-division control operation in a nonvolatile ferroelectric capacitor, and outputs switching control signals RE and REB to control a selective switching operation.

The switching unit 113 comprises transmission gates T3 and T4. The transmission gates T3 and T4 are turned on when the switching control signal RE is at a high level and the switching control signal REB is at a low level. Then, the transmission gates T3 and T4 output column addresses A0~Ay applied through the input buffer into the column address latch 20.

The switching unit 114 comprises transmission gates T5 and T6. The transmission gates T5 and T6 are turned on when the switching control signal REB is at a high level and the switching control signal RE is at a low level. The transmission gates T5 and T6 output addresses A0~Am applied through the input buffer into the column address latch 20.

Figure 16:
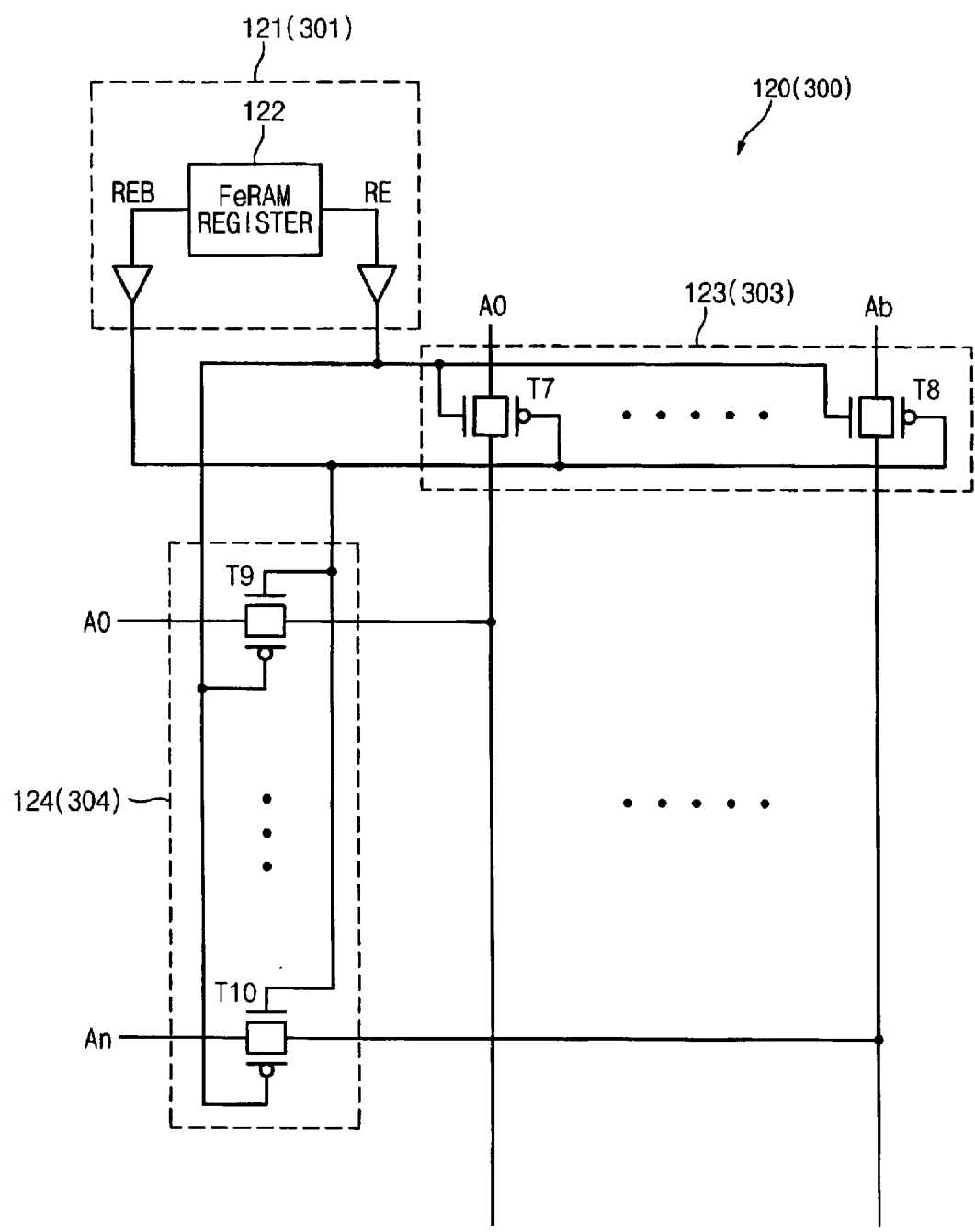

FIG. 16 is a circuit diagram of a switching unit applied to the switching controllers 120 and 300 of FIGS. 8 and 10. Here, the switching controller 120 of FIG. 8 is exemplified because it has the same structure and operation as those of the switching controller 300 of FIG. 10.

The switching controller 120 comprises the controller 121, and the switching units 123 and 124.

The controller 121 comprises a FeRAM register 122. The FeRAM register 122 sets a selective output operation of the buffer and a time-sharing control operation in a nonvolatile ferroelectric capacitor, and outputs switching control signals RE and REB to control a selective switching operation.

The switching unit 123 comprises transmission gates T7 and T8. The transmission gates T7 and T8 are turned on when the switching control signal RE is at a high level and the switching control signal REB is at a low level. Then, the transmission gates T7 and T8 output bank addresses A0~Ab applied through the input buffer into the bank selector 40.

The switching unit 124 comprises transmission gates T9 and T10. The transmission gates T9 and T10 are turned on when the switching control signal REB is at a high level and the switching control signal RE is at a low level. The transmission gates T9 and T10 output addresses A0~An applied through the input buffer into the bank selector 40.

Figure 17:
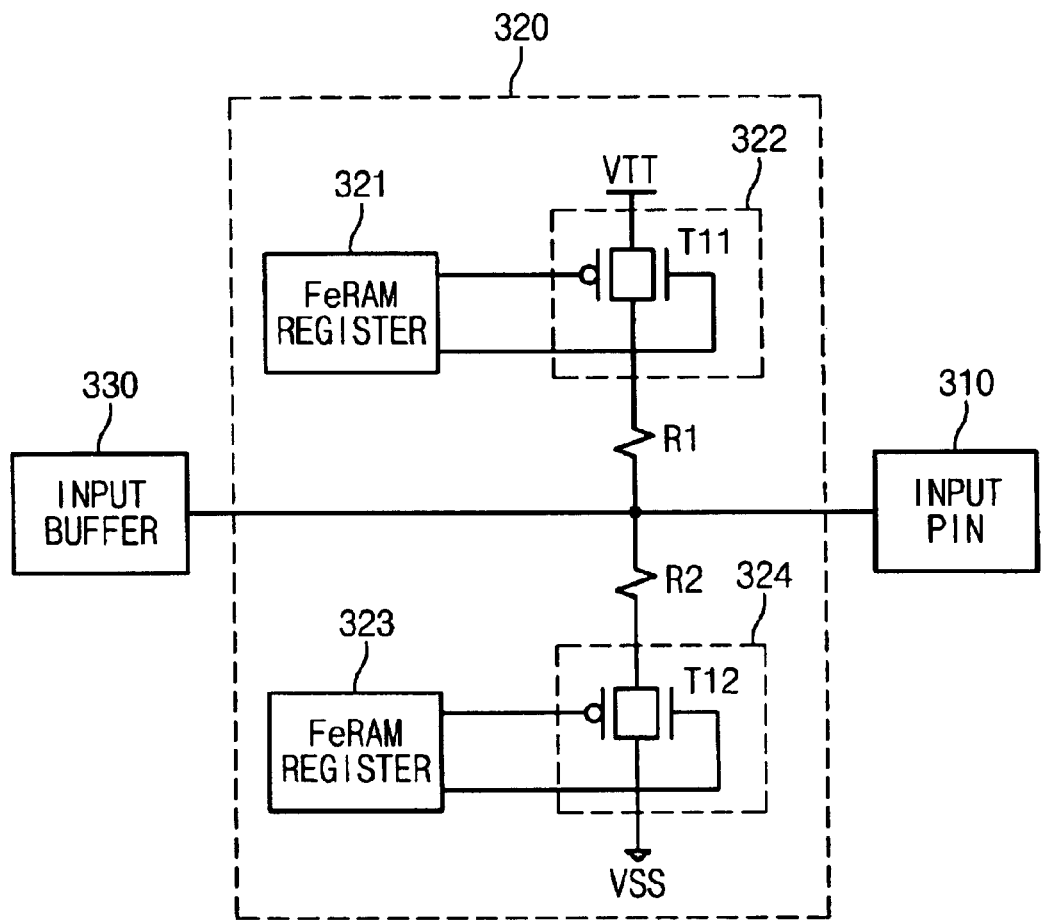
FIGS. 17 to 20 are diagrams illustrating examples of a termination resistance regulator according to an embodiment of the present invention.

FIG. 17 is a diagram illustrating the termination resistance regulator 320 to improve a transmission characteristic of input signals.

The termination resistance regulator 320 comprised in a nonvolatile ferroelectric memory chip, is located between an input pin 310 and an input buffer 330. The input pin 310 receives addresses, control signals and data bus signals on a system bus.

The termination resistance regulator 320 comprises FeRAM registers 321 and 323, termination switching units 322 and 324, and termination resistors R1 and R2.

The FeRAM registers 321 and 323 set data to control switching operations of the termination switching units 322 and 324 in a nonvolatile ferroelectric capacitor. The termination switching unit 322 comprises a transmission gate T1 for selectively outputting a termination voltage VTT into the termination resistance R1 in response to an output signal from the FeRAM register 321. The termination switching unit 324 comprises a transmission gate T12 for selectively outputting a ground voltage VSS into the termination resistance R2 in response to an output signal from the FeRAM register 323.

When an input signal applied from the input pin 310 is transmitted into the input buffer 330, the termination resistors R1 and R2 absorb noise reflection signals, thereby improving a transmission characteristic of input signals. Since initial program data to control termination are stored in the nonvolatile ferroelectric capacitors, the FeRAM registers 321 and 323 can maintain the stored data even when power is off.

Figure 18:
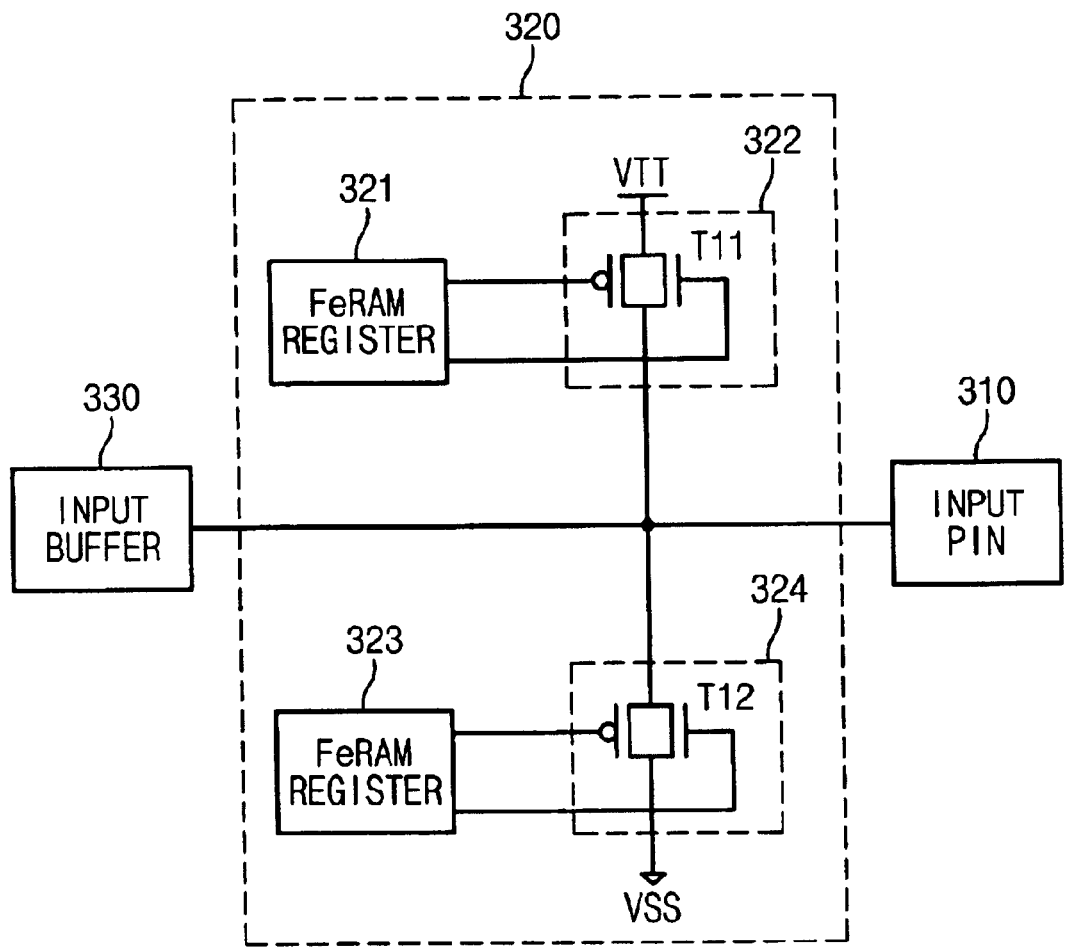

FIG. 18 shows another example of the termination resistance regulator 320.

When compared to the embodiment of FIG. 17, the termination resistance regulator 320 does not comprise the termination resistors R1 and R2. When the termination switching units 322 and 324 are activated, noise reflection signals are absorbed by self-resistance of the termination switching units 322 and 324, thereby improving a transmission characteristic of input signals.

Figure 19:
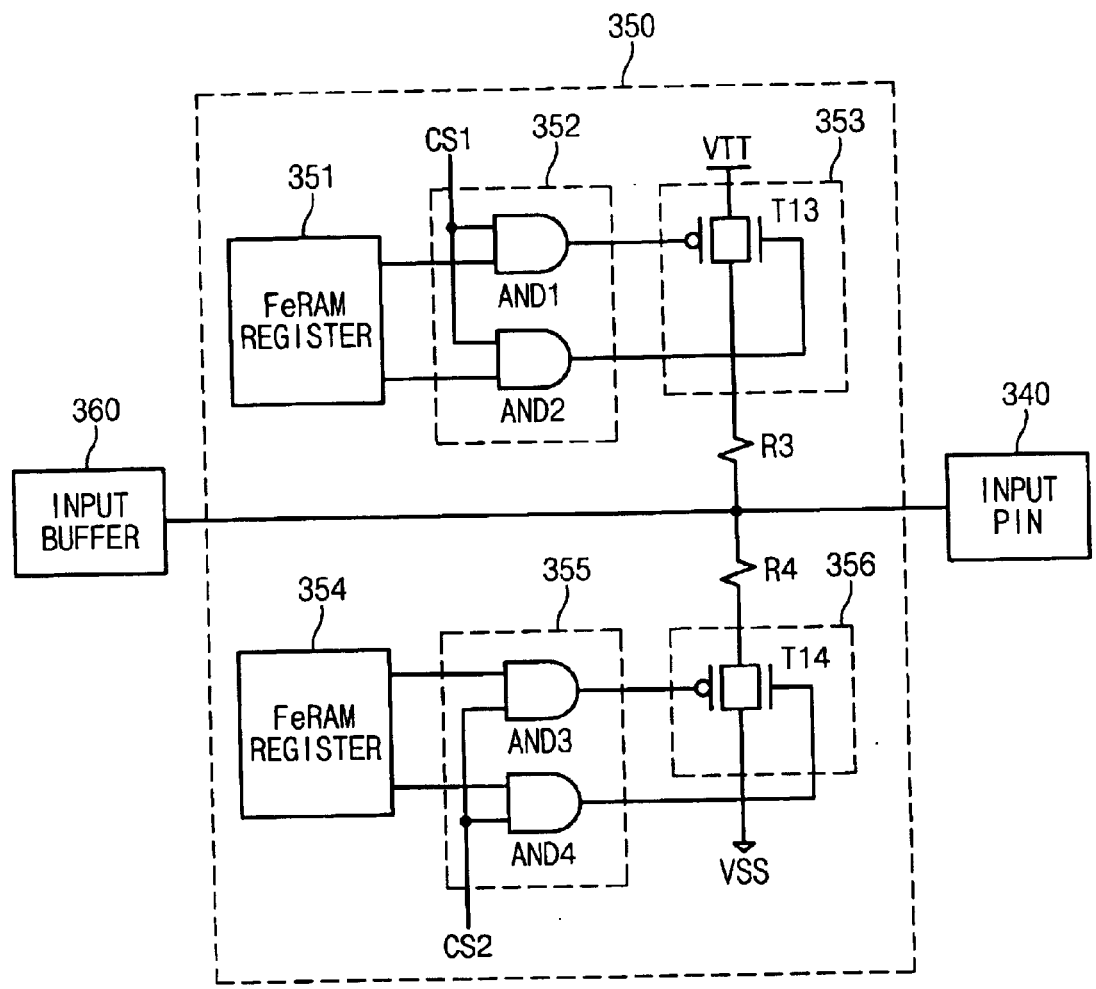

FIG. 19 shows still another example of the termination resistance regulator 350 to improve a transmission characteristic of input signals.

The termination resistance regulator 350 comprised in a nonvolatile ferroelectric memory chip, is located between an input pin 340 and an input buffer 360. Here, the input pin 340 receives addresses, control signals and data bus signals on a system bus.

The termination resistance regulator 350 comprises FeRAM registers 351 and 354, termination controllers 352 and 355, termination switching units 353 and 356, and termination resistors R3 and R4.

The FeRAM registers 351 and 354 set data to control switching operations of the termination switching units 353 and 356 in a nonvolatile ferroelectric capacitor.

The termination controller 352 comprises AND gates AND1 and AND2 each for performing an AND operation on a chip driving control signal CS1 and output signals from the FeRAM registers 351. As a result, when the chip driving control signal CS1 and the output signals from the FeRAM register 351 are activated at the same time, the termination switching unit 353 is activated. The termination controller 355 comprises AND gates AND3 and AND4 each for performing an AND operation on a chip driving control signal CS2 and output signals from the FeRAM register 354. As a result, when the chip driving control signal CS2 and the output signals from the FeRAM register 354 are activate at the same time, the termination switching unit 356 is activate.

The termination switching unit 353 comprises a transmission gate T13 for selectively outputting a termination voltage VTT into the termination resistor R3 in response to an output signal from the termination controller 352. The termination switching unit 356 comprises a transmission gate T14 for selectively outputting a ground voltage VSS into the termination resistor R4 in response to an output signal from the termination controller 355.

When an input signal applied from the input pin 340 is transmitted into the input buffer 360, the termination resistors R3 and R4 absorb noise reflection signals, thereby improving a transmission characteristic of input signals. Since initial program data to control termination are stored in the nonvolatile ferroelectric capacitors, the FeRAM registers 351 and 354 can maintain the stored data even when power is off.

Figure 20:
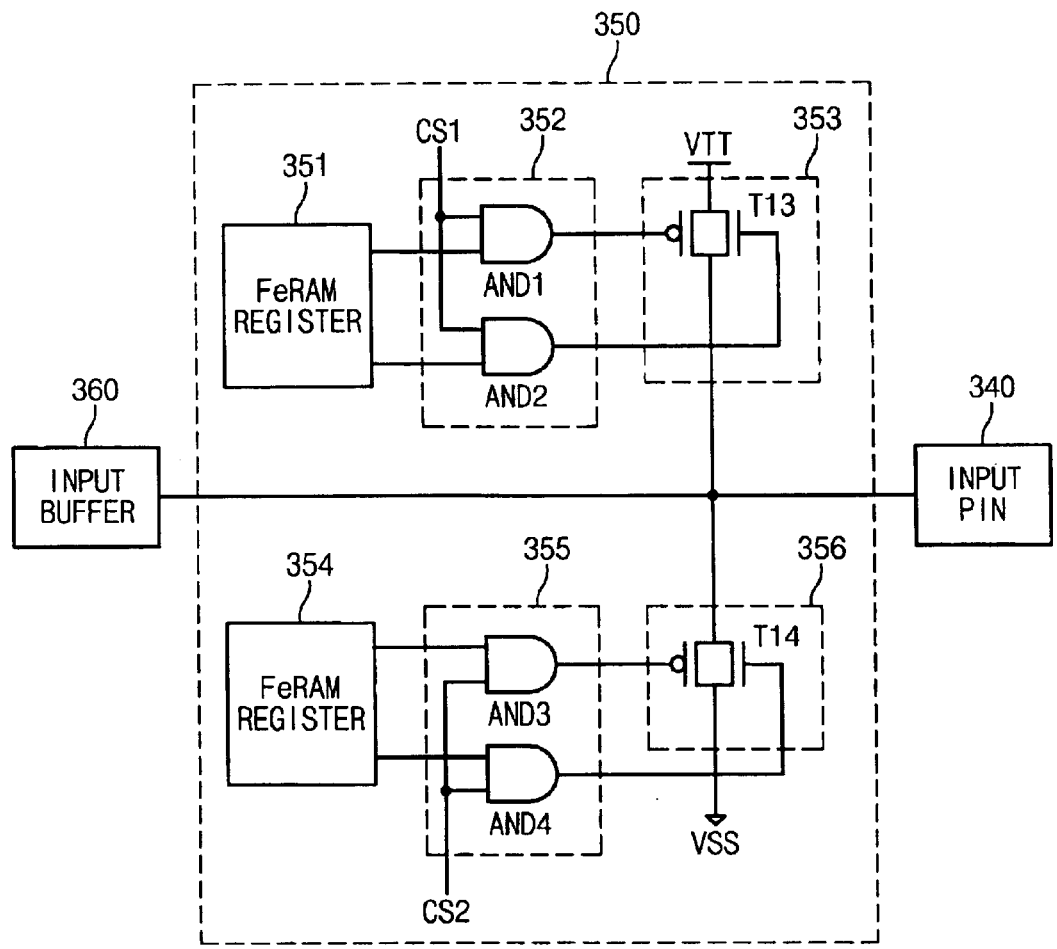

FIG. 20 shows still another example of the termination resistance regulator 350. When compared to the embodiment of FIG. 19, the termination resistance regulator 350 does not comprise the termination resistors R3 and R4. When the termination switching units 353 and 356 are activated, noise reflection signals are absorbed by self-resistance of the termination switching units 353 and 356, thereby improving a transmission characteristic of input signals.

Figure 21:
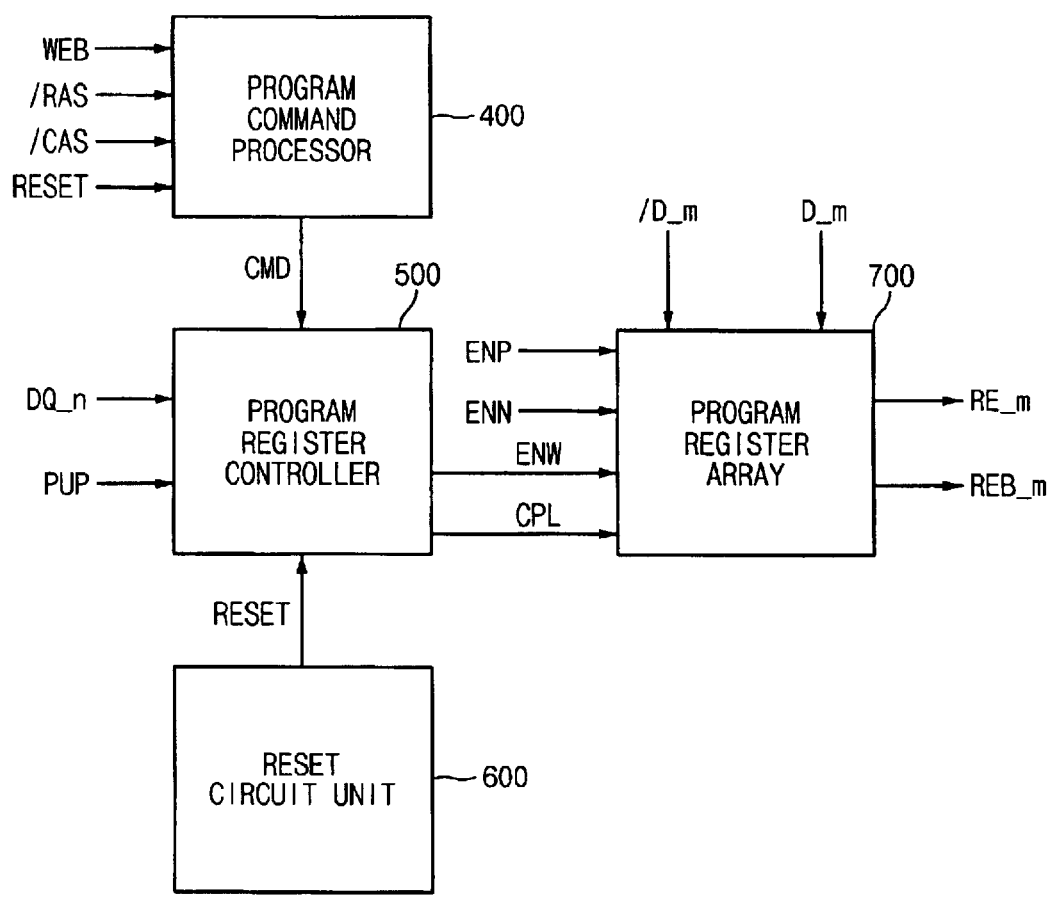
FIG. 21 is a diagram of a nonvolatile ferroelectric mode register and a FRAM register according to an embodiment of the present invention.

FIG. 21 is a diagram of a nonvolatile ferroelectric mode register and a FRAM register which are applied to the nonvolatile ferroelectric mode registers 60 and 240 and the FeRAM registers of FIGS. 15 and 20. Here, the nonvolatile ferroelectric mode register 60 is exemplified.

The nonvolatile ferroelectric mode register 60 comprises a program command processor 400, a program register controller 500, a reset circuit unit 600 and a program register array 700.

The program command processor 400 codes a program command in response to the write enable signal WEB, the row address strobe signal /RAS, the column address strobe signal /CAS and the reset signal RESET, and outputs a command signal CMD. The program register controller 500 performs a logic operation on the command signal CMD, a power-up detecting signal PUP and input data DQ_n, and outputs a write control signal ENW and a cell plate signal CPL.

The reset circuit unit 600 outputs the reset signal RESET into the program register control unit 500 in a power-up mode. The program register array 700 programs data D_m and /D_m inputted externally in a nonvolatile ferroelectric capacitor in response to a pull-up enable signal ENP, a pull-down enable signal ENN, the write control signal ENW and the cell plate signal CPL, and outputs control signals RE_m and REB_m.

When the command signal CMD is generated from the program command processor 400, the program register control unit 500 changes or sets configuration data of the program in the program register array 700.

The reset circuit unit 600 generates the reset signal RESET in the power-up mode, and activates the program register controller 500. Control signals outputted from the program register controller 500 are register operation signals to initialize nonvolatile data of the program register array 700.

Figure 22:
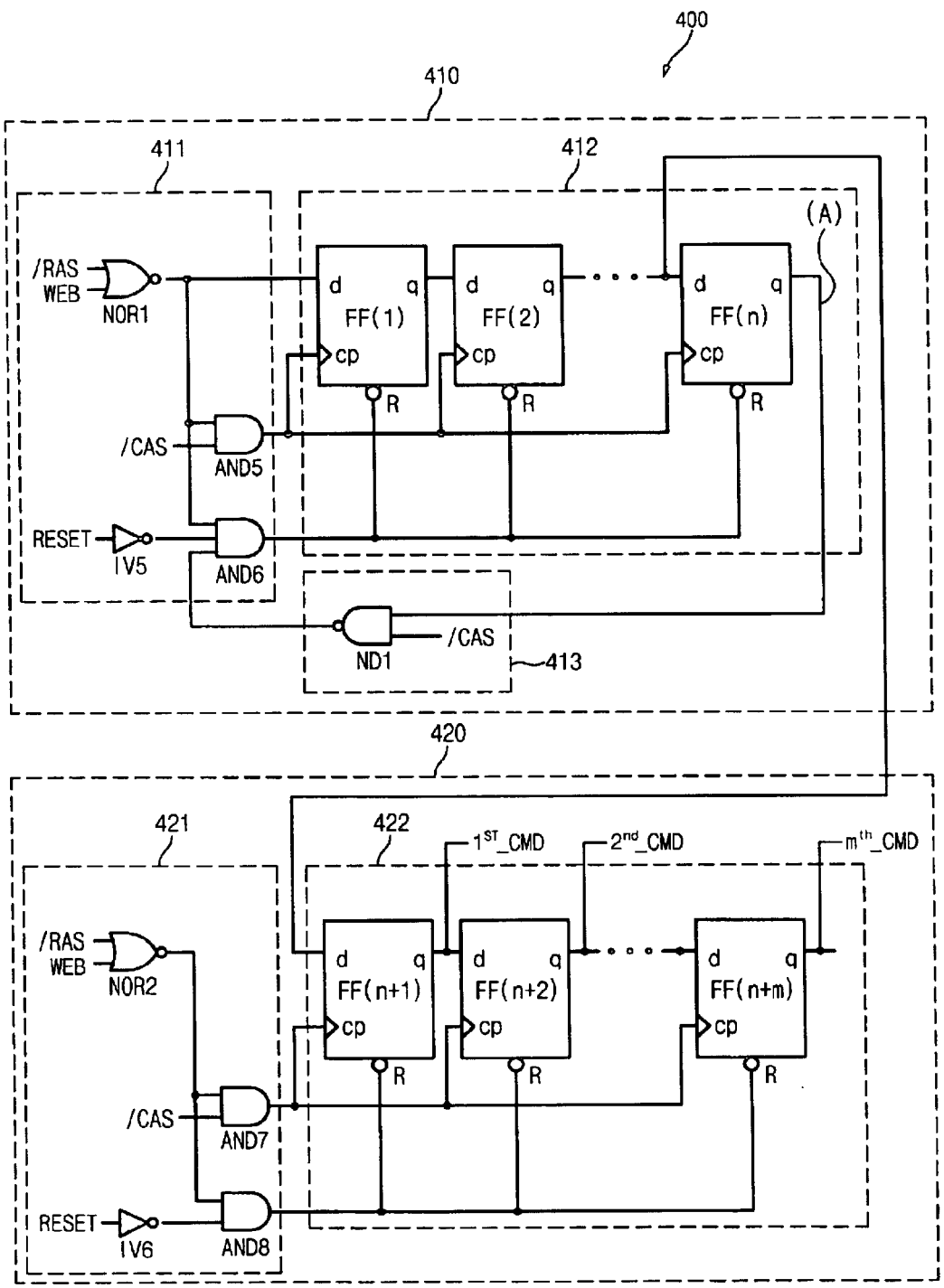
FIG. 22 is a diagram of a program command processor of FIG. 21.

FIG. 22 is a diagram of the program command processor 400 of FIG. 21.

The program command processor 400 comprises a command controller 410 and a multiple command generator 420.

The command controller 410 comprises a logic unit 411, a flip-flop unit 412 and an overtoggle detector 413.

The logic unit 411 comprises an NOR gate NOR1, AND gates AND5 and AND6, and an inverter IV5. The NOR gate NOR1 performs an NOR operation on the row address strobe signal /RAS and the write enable signal WEB. The AND gate AND5 performs an AND operation on an output signal from the NOR gate NOR1 and the column address strobe signal /CAS. The AND gate AND6 performs an AND operation on the output signal from the NOR gate NOR1, the reset signal inverted by the inverter IV5 and an output signal from the overtoggle detector 413.

The flip-flop unit 412 comprises a plurality of flip-flops FF connected in series. Each flip-flop FF comprises an input terminal d to receive the output signal from the NOR gate NOR1 and an output terminal q. The command signal CMD is outputted through a node A. Also, each flip-flop FF comprises an input terminal cp to receive an activation synchronization signal from the AND gate AND5, and a reset terminal R to receive a reset signal from the AND gate AND6.

While the row address strobe signal /RAS and the write enable signal WEB are at a low level, the column address strobe signal /CAS is inputted into the input terminal cp of the flip-flop FF. If one of the row address strobe signal /RAS and the write enable signal WEB becomes at a high level, the reset terminal R of the flip-flop receives a low level signal, and the flip-flop is reset. In an interval where the reset signal RESET is at a high level, the flip-flop FF is reset.

The overtoggle detector 413 comprises an NAND gate ND1 for performing an NAND operation on an output signal of the node A and the column address strobe signal /CAS. The overtoggle detector 413 resets the flip-flop unit 412 when the column address strobe signal /CAS toggles over n times to cause overtoggle. Thus, the number of toggles is set to be different in each program command processor 400.

The multiple command generator 420 comprises a logic unit 421 and a flip-flop unit 422.

The logic unit 421 comprises an NOR gate NOR2, AND gates AND7 and AND8, and an inverter IV6. The NOR gate NOR2 performs an NOR operation on the row address strobe signal /RAS and the write enable signal WEB. The AND gate AND7 performs an AND operation on an output signal from the NOR gate NOR2 and the column address strobe signal /CAS. The AND gate AND8 performs an AND operation on an output signal from the NOR gate NOR2 and the reset signal RESET inverted by the inverter IV6.

The flip-flop unit 422 comprises a plurality of flip-flops FF connected in series. The flip-flop FF(n+1) has an input terminal d to receive an output signal from the flip-flop FF(n−1) of the command controller 410. Through input terminals d and output terminals q serially connected each other, a high pulse outputted from the flip-flop FF(n+1) sequentially moves into the next flip-flop. As a result, the flip-flops FF sequentially output a plurality of command signal such as a $1^{st}\_CMD$, a $2^{nd}\_CMD$, ..., a $m^{th}\_CMD$.

Each flip-flop has an input terminal cp to receive an activation synchronization signal outputted from the AND gate AND7, and a reset terminal R to receive a reset signal outputted from the AND gate AND8.

When the row address strobe signal /RAS and the write enable signal WEB are at a low level, the column address strobe signal /CAS is inputted into the input terminal cp of each flip-flop FF. When one of the row address strobe signal /RAS or write enable signal WEB becomes at a high level, a low level signal is inputted into the reset terminal R of each flip-flop FF, and the flip-flop is reset. In an interval where the reset signal RESET is at a high level, the flip-flop FF is reset in a power-up mode.

Figure 23:
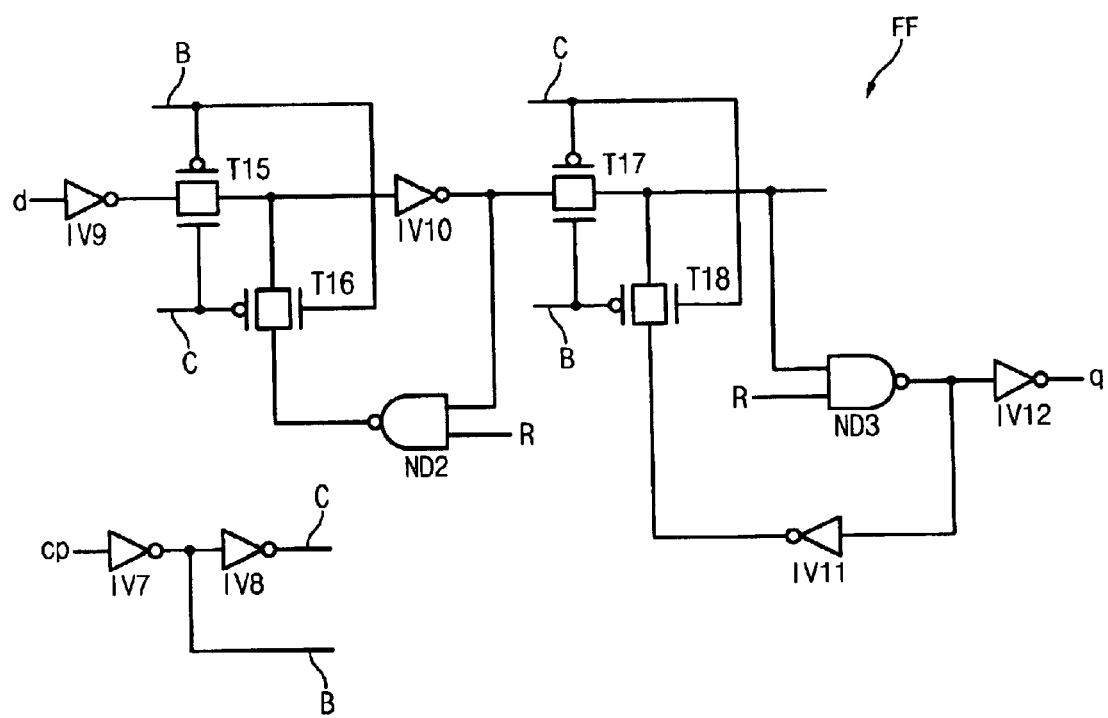
FIG. 23 is a circuit diagram of a flip-flop of FIG. 22.

FIG. 23 is a circuit diagram of the flip-flop FF of FIG. 22.

The flip-flop comprises transmission gates T15~T18, NAND gates ND2 and ND3, and inverters IV7~IV12. Here, the inverter IV7 inverts an output signal from the input terminal cp, and the inverter IV8 inverts an output signal from the inverter IV7.

The transmission gate T15 selectively outputs an output signal from the input terminal d inverted by the inverter IV9 depending on output states of nodes B and C. The NAND gate ND2 performs an NAND operation on output signal from the inverter IV10 and the reset terminal R. The transmission gate T16 selectively outputs an output signal from the NAND gate ND2 depending on the output states of the node B and C.

The transmission gate T17 selectively outputs an output signal from the inverter IV10 depending on the output states of the node B and C. The NAND gate ND3 performs an NAND operation on output signals from the transmission gate T17 and the reset terminal R.

The transmission gate T18 selectively outputs an output signal from the inverter IV11 depending on the output states of the node B and C. The inverter IV12 inverts an output signal from the NAND gate ND3, and outputs the inverted signal into the output terminal q.

Data inputted from the input terminal d move rightward whenever a control signal inputted through the input terminal cp toggles once. When a low level signal is inputted into the reset terminal R, a low level signal is outputted into the output terminal q to reset the flip-flop FF.

Figure 24:
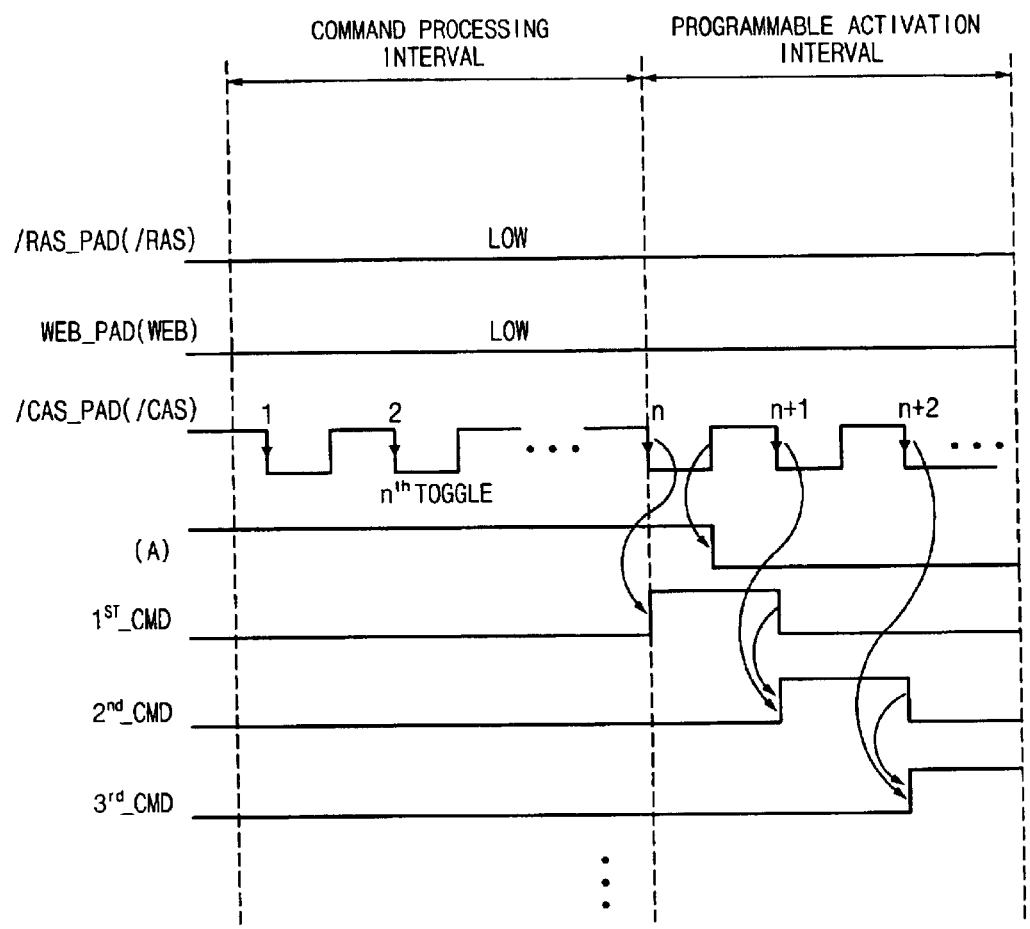
FIG. 24 is a timing diagram of the program command processor of FIG. 21.

FIG. 24 is a timing diagram of the program command processor 400 of FIG. 21.

In the command processing interval, the row address strobe signal /RAS and the write enable signal WEB are maintained at a low level. While the column address strobe signal /CAS toggles n times, the command signal CMD is maintained at a disable state.

Thereafter, if an programmable activation interval starts and the column address strobe signal /CAS toggles n times, the command signal $1^{st}\_CMD$ outputted from the flip-flop FF(n+1) is enabled to a high level.

If the overtoggle detector 413 detects overtoggle after the $n^{th}$ toggle, the output signal of the node A is disabled. Here, since an output signal of the flip-flop FF(n−1) is inputted into the flip-flop FF(n+1), the multiple command generator 420 is not affected by the overtoggle detector 413.

Next, if the $(n+1)^{th}$ toggle occurs, the command signal $1^{st}\_CMD$ is disabled, and the command signal $2^{nd}\_CMD$ outputted from the flip-flop FF(n+2) is enabled to a high level.

When the number of toggles of the column address strobe signal /CAS is regulated, the number of flip-flops FF connected serially is regulated.

Figure 25:
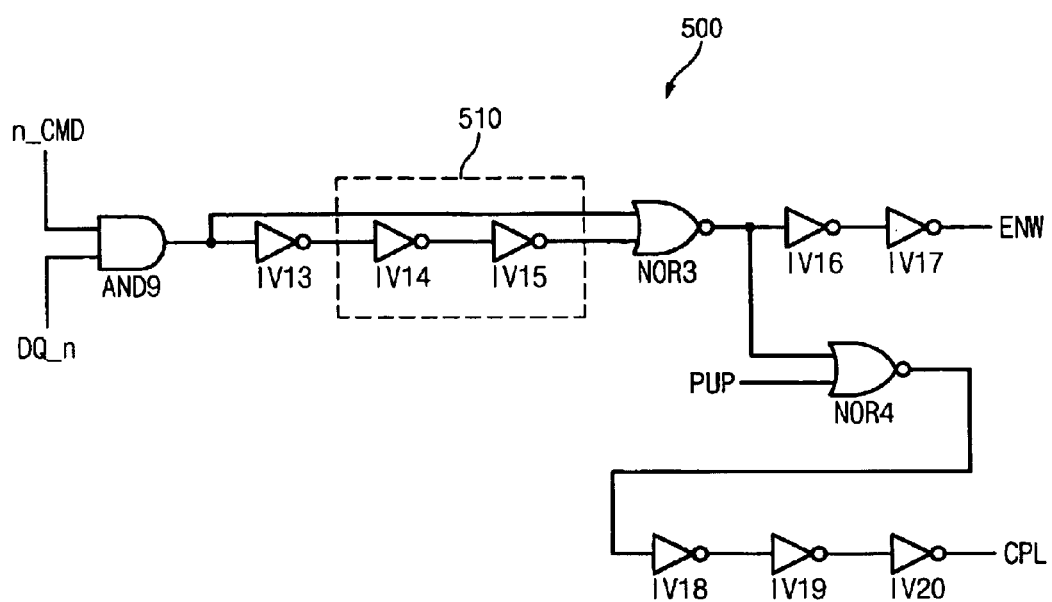
FIG. 25 is a circuit diagram of a program register controller of FIG. 21.

FIG. 25 is a circuit diagram of the program register controller 500 of FIG. 21.

The program register controller 500 comprises an AND gate AND9, inverters IV13~IV20, and NOR gates NOR3 and NOR4. The AND gate AND9 performs an AND operation on the command signal $n^{th}$_CMD and input data DQ_n. The inverters IV13~IV15 invert and delay an output signal from the AND gate AND9.

The NOR gate NOR3 performs an NOR operation on output signals from the AND gate AND9 and a delay unit 510 comprising the inverters IV14 and IV15. The inverter IV6 and IV17 delay an output signal from the NOR gate NOR3 to output the write control signal ENW.

The NOR gate NOR4 performs an NOR operation on an output signal from the NOR gate NOR3 and the power-up detecting signal PUP. The inverters IV18~IV20 invert and delay an output signal from the NOR gate NOR4 to output the cell plate signal CPL.

Here, the power-up detecting signal PUP is to reset the register after data stored in the register are read in the initial reset mode.

If the input data DQ_n are toggled by using an input pad after the command signal $n^{th}$_CMD is activated to a high level, the write control signal ENW and the cell plate signal CPL having a pulse width for a delay time of the delay unit 510.

Figure 26:
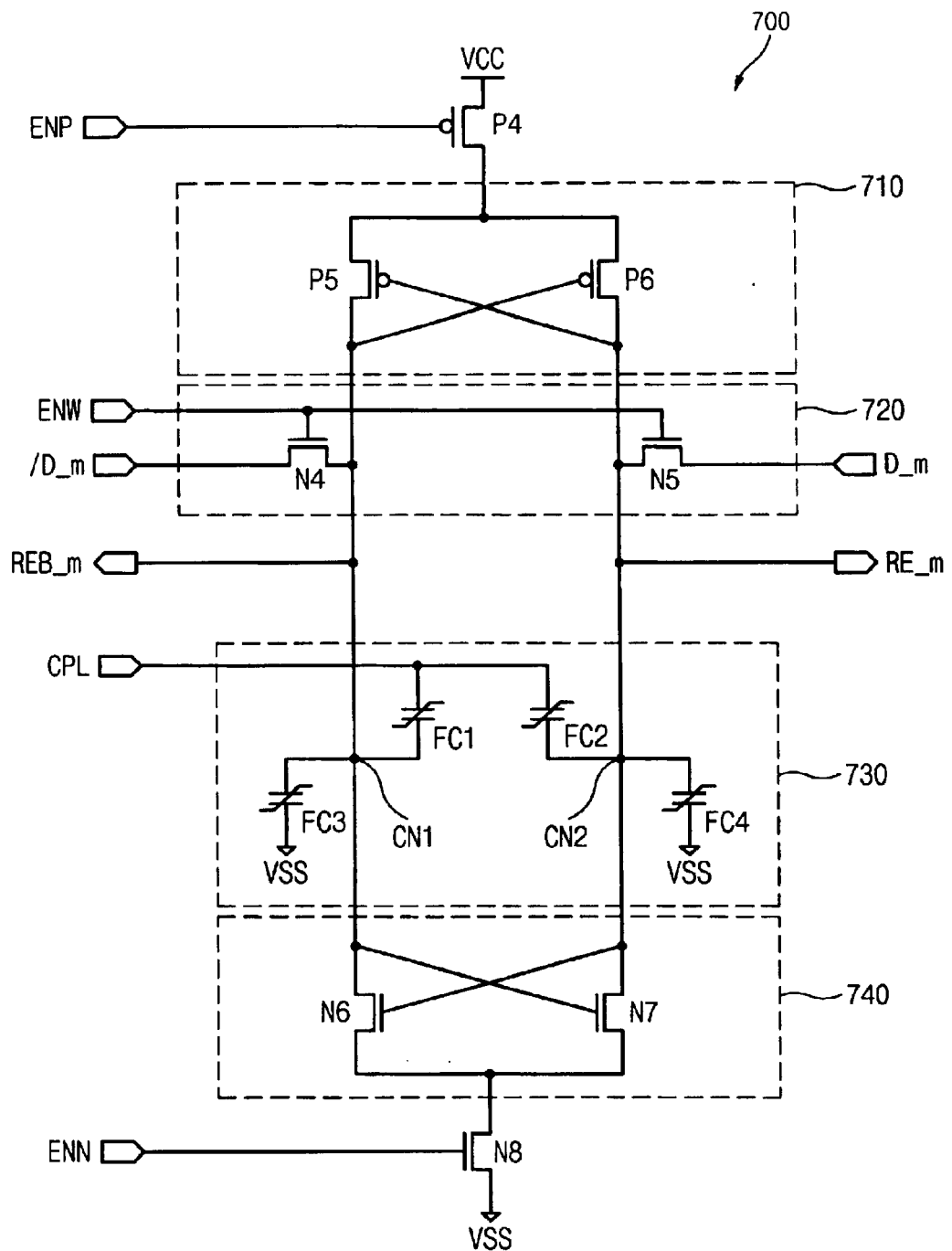
FIG. 26 is a circuit diagram of a program register array of FIG. 21.

FIG. 26 is a circuit diagram of the program register array 700 of FIG. 21.

The program register array 700 comprises a pull-up switch P4, a pull-up driver 710, a write enable controller 720, a ferroelectric capacitor unit 730, a pull-down driver 740 and a pull-down switch N8.

The pull-up switch P4, connected between the power voltage terminal and the pull-up driver 710, has a gate to receive the pull-up enable signal ENP. The pull-up driver 710, connected between the pull-up switch P4 and the write enable controller 720, comprises PMOS transistors P5 and P6 connected with a latch structure between nodes CN1 and CN2.

The write enable controller 720 comprises NMOS transistors N4 and N5. The NMOS transistors N4, connected between a data /D_m input terminal and the node CN1, receives the write control signal ENW, and the NMOS transistor N5, connected between a data D_m input terminal and the node CN2, receives the write control signal ENW.

The ferroelectric capacitor unit 730 comprises nonvolatile ferroelectric capacitors FC1~FC4. The nonvolatile ferroelectric capacitor FC1 has one terminal connected to the node CN1 and the other terminal to receive the cell plate signal CPL. The nonvolatile ferroelectric capacitor FC2 has one terminal connected to the node CN2 and the other terminal to receive the cell plate signal CPL.

The nonvolatile ferroelectric capacitor FC3 is connected between the node CN1 and the ground voltage terminal, and the nonvolatile ferroelectric capacitor FC4 is connected between the node CN2 and the ground voltage terminal. Here, the nonvolatile ferroelectric capacitors FC3 and FC4 may be selectively added depending on loading level control of the nodes CN1 and CN2.

The pull-down driver 740, connected between the ferroelectric capacitor unit 730 and the pull-down switch N8, comprises NMOS transistors N6 and N7 connected with a latch structure between the nodes CN1 and CN2. The pull-down switch N8, connected between the pull-down driver 740 and the ground voltage VSS terminal, has a gate to receive the pull-down enable signal ENN. The program register array 700 outputs control signals REB_m and RE_m through an output terminal.

Figure 27:
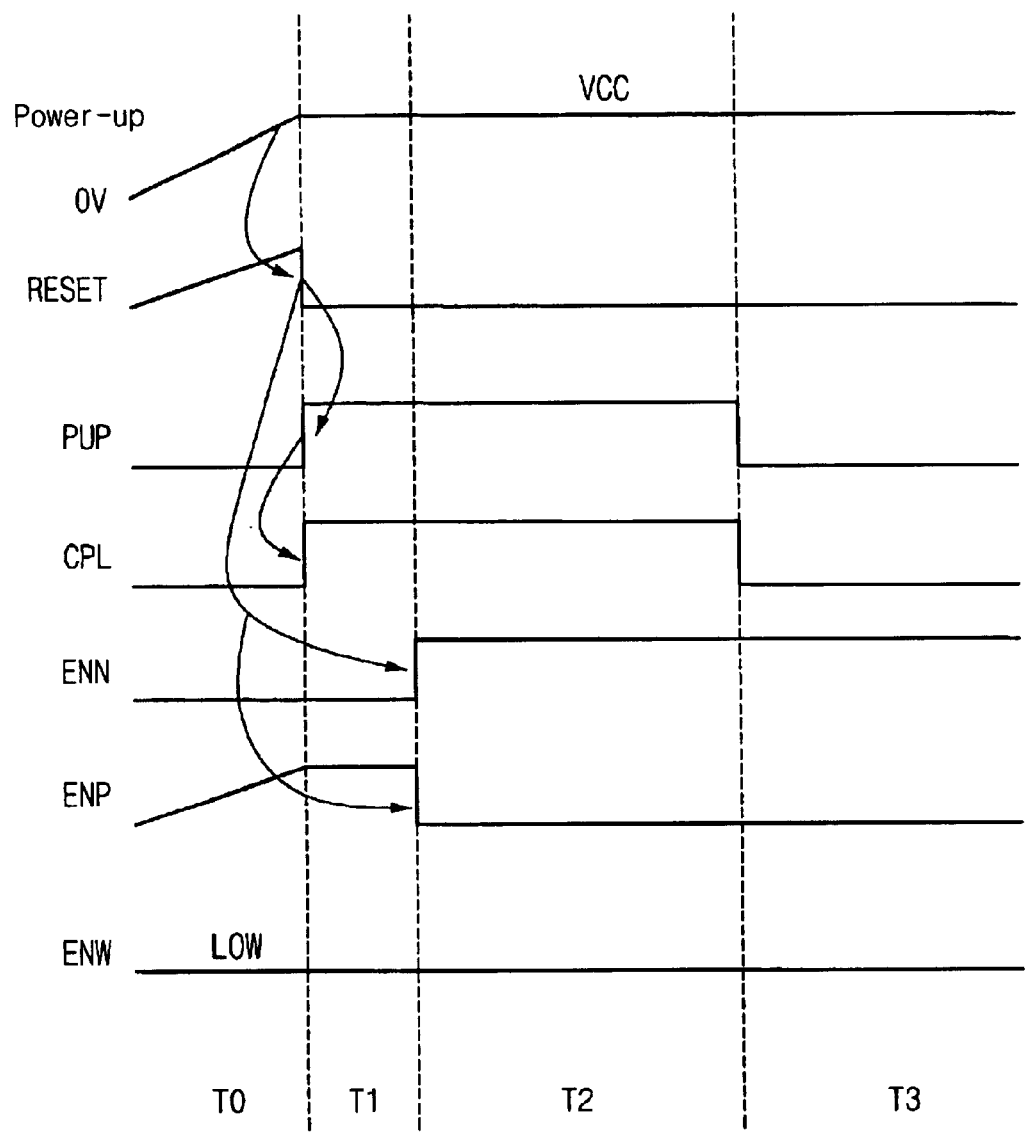
FIG. 27 is a timing diagram of the power-up operation according to an embodiment of the present invention.

FIG. 27 is a timing diagram of the power-up operation according to an embodiment of the present invention.

In an interval T1 after the power-up mode, when power reaches a stabilized power voltage VCC level, the reset signal RESET is disabled and the power-up detecting signal PUP is enabled.

Then, the cell plate signal CPL transits to a high level as the power-up detecting signal PUP is enabled. Here, charges stored in the nonvolatile ferroelectric capacitors FC1 and FC2 of the program register array 700 generate voltage difference between the nodes CN1 and CN2 by capacitance load of the nonvolatile ferroelectric capacitors FC3 and FC4.

If an interval T2 where sufficient voltage difference is generated in the nodes CN1 and CN2 starts, the pull-down enable signal ENN is enabled to a high level, and the pull-up enable signal ENP is disabled to a low level. As a result, data of the nodes CN1 and CN2 are amplified.

Thereafter, if an interval T3 starts and data amplification of nodes CN1 and CN2 is completed, the power-up detecting signal PUP and the cell plate signal CPL transits to the low level again. As a result, the destroyed high data of the nonvolatile ferroelectric capacitor FC1 or FC2 are restored. Here, the write control signal ENW is maintained at the low level to prevent external data to be re-written.

Figure 28:
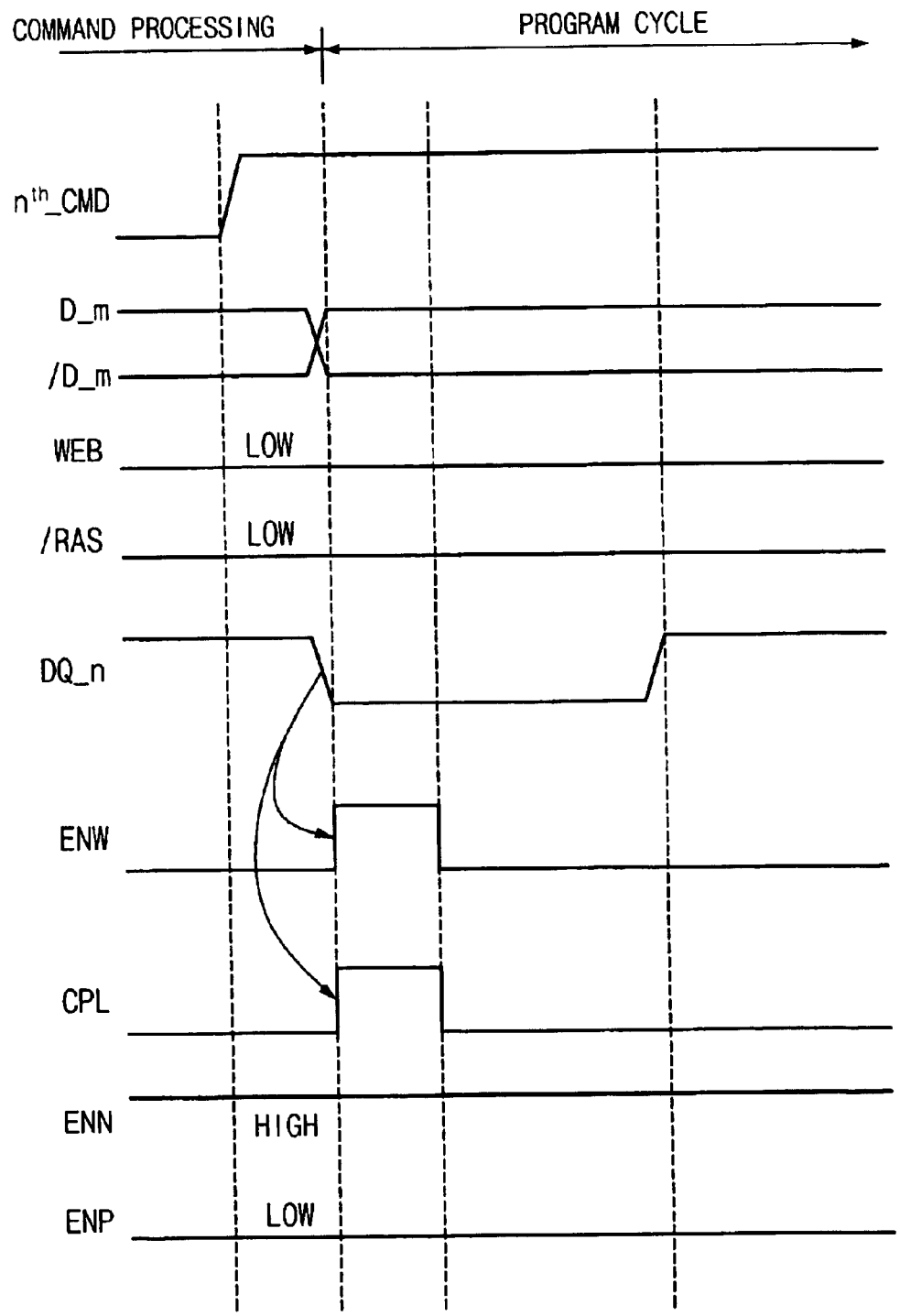
FIG. 28 is a timing diagram of the program operation according to an embodiment of the present invention.

FIG. 28 is a timing diagram of the program operation after the command signal $n^{th}$_CMD is activated to a high level.

If a predetermined time passes after the command signal $n^{th}$_CMD is activated to a high level, new data D_m and /D_m are inputted. If the input data DQ_n applied from the data input/output pad is disabled from a high to low level, the program cycle starts. As a result, the write control signal to write new data in the register and the cell plate signal CPL transit to a high level. Here, the pull-down enable signal ENN is maintained at the high level, and the pull-up enable signal ENP is maintained at the low level. The write enable signal WEB and the row address strobe signal /RAS are maintained at the low level.

If the command signal $n^{th}$_CMD having a high level is inputted into the program register controller 500, signal input from the program command processor 400 is prevented. As a result, the program operation can be performed while no more control command is inputted.

As described above, in a semiconductor memory device according to an embodiment of the present invention, a mode reset register is embodied with a nonvolatile ferroelectric capacitor so that the mode register of the semiconductor memory device may have a nonvolatile characteristic. Specifically, the same operation as that of SDR SDRAM and DDR SDRAM can be performed by applying the nonvolatile ferroelectric capacitor to the mode register.

Additionally, in an embodiment, a semiconductor memory device comprising a switching means for selecting multiple addresses can maintain compatibility with SRAM/flash. The semiconductor memory device comprises improved on-chip termination circuits, thereby reducing noise of transmission signals, securing margin of good quality and decreasing area of system board and cost. Most of all, power consumption can be reduced because stored data is maintained by using the nonvolatile ferroelectric mode register in a power-off state.

What is claimed is:

1. A semiconductor memory device comprising:
   an input buffer for detecting a logic level of an address inputted by using a reference voltage;
   an address latch for latching an address outputted from the input buffer, and for sequentially outputting a bank selecting signal, a row address and a column address;
   a nonvolatile ferroelectric mode register for programming parameters on a chip operation in a nonvolatile ferroelectric capacitor, and for outputting a control signal to control a synchronization operation of a cell array depending on a programmed code; and
   a bank array, comprising a plurality of cell arrays, controlling read/write operations of one cell array synchronously with respect to the control signal in response to the bank selecting signal, the row address and the column address.

2. The device according to claim 1, wherein the logic level of the address detected in the input buffer is a stub series terminated transceiver logic level.

3. The device according to claim 1, wherein the input buffer comprises:
   a differential amplifier for comparing and amplifying voltage levels of the reference voltage and the address when a differential amplification enable signal is enabled; and
   a driver for precharging an output signal of the differential amplifier to a power voltage when the differential amplification enable signal is disabled.

4. The device according to claim 1, wherein the address latch comprises:
   a column address latch for latching an address outputted from the input buffer, and for outputting the column address when a column address strobe signal is activated;
   a row address latch for latching an address outputted from the input buffer, and for outputting the row address when a row address strobe signal is activated; and
   a bank selector for latching an address outputted from the input buffer, and for outputting the bank selecting signal and the bank address when the row address strobe signal is activated.

5. The device according to claim 1, wherein the input buffer comprises:
   a column address buffer for detecting a logic level of a column address inputted by the reference voltage;
   a row address buffer for detecting a logic level of a row address inputted by the reference voltage; and
   a bank address buffer for detecting a logic level of a bank address inputted by the reference voltage.

6. The device according to claim 5, further comprising a switching controller for selectively switching an output paths of the column address buffer, the row address buffer and the bank address buffer depending on the programmed code in the nonvolatile ferroelectric capacitor, and for time-divisionary controlling the bank address, the row address and the column address sequentially.

7. The device according to claim 6, wherein the switching controller comprises:
   a first switching controller for selectively controlling an output paths of the column address buffer and the row address buffer in response to a first switching control signal generated depending on a programmed code in a first nonvolatile ferroelectric capacitor; and
   a second switching controller for selectively controlling an output paths of the row address buffer and the bank address buffer in response to a second switching control signal generated depending on a programmed code in a second nonvolatile ferroelectric capacitor.

8. The device according to claim 7, wherein the first switching controller comprises:
   a first controller, comprising the first nonvolatile ferroelectric capacitor, generating the first switching control signal;
   a first switching unit for selecting an output path of the column address buffer when the first switching control signal is activate; and
   a second switching unit for selecting an output path of the row address buffer when the first switching control signal is inactivated.

9. The device according to claim 7, wherein the second switching controller comprises:
   a second controller, comprising the second nonvolatile ferroelectric capacitor, for generating the second switching control signal;
   a third switching unit for selecting an output path of the bank address buffer when the second switching control signal is activated; and
   a fourth switching unit for selecting an output path of the row address buffer when the second switching control signal is inactivated.

10. The device according to claim 1, comprising:
    an address transition detector for detecting transition of the row address and the bank address, and for activating an address transition detecting signal when at least one of addresses transits;
    a column burst counter for counting the column address synchronously with respect to the control signal in a burst mode;
    a control signal generator for selectively generating driving control signals necessary for the chip operation depending on control of the nonvolatile ferroelectric mode register;
    a delay-locked loop for generating a clock of the same waveform having a phase difference synchronously with respect to a clock signal applied to the control signal generator;
    a data strobe buffer for outputting a data strobe signal to control data output synchronously with respect to the clock;
    a data input buffer for comparing input data with the reference voltage and outputting the comparison result into the bank array; and
    a data output buffer for outputting data stored in the cell array synchronously with respect to the data strobe signal.

11. The device according to claim 1, further comprising a termination resistance regulator, located between the input buffer and an input pin, for selectively controlling termination resistance of an input signal inputted through the input pin depending on the programmed code in the nonvolatile ferroelectric capacitor.

12. The device according to claim 11, wherein the termination resistance regulator comprises:
    a first nonvolatile ferroelectric register for selectively outputting a first switching driving signal and a second switching driving signal to control the termination resistance depending on data set in the nonvolatile ferroelectric capacitor;
    a first termination switching unit, switched in response to the first switching driving signal, for selectively supplying a termination voltage; and a second termination switching unit, switched in response to the second switching driving signal, for selectively supplying a ground voltage.

13. The device according to claim 12, wherein the termination resistance regulator further comprises:
a first termination resistor, located between the first termination switching unit and a supply node of the input signal, for controlling a transmission characteristic of the input signal; and
a second termination resistor, located between the second termination switching unit and a supply node of the input signal, for controlling a transmission characteristic of the input signal.

14. The device according to claim 11, wherein the termination resistance regulator comprises:
a second nonvolatile ferroelectric register for selectively outputting a third switching driving signal and a fourth switching driving signal to control the termination resistance depending on data set in the nonvolatile ferroelectric capacitor;
a first termination controller for performing a logic operation on the third switching driving signal and a first chip driving control signal;
a third termination switching unit, switched by control of the first termination controller, for selectively supplying a termination voltage;
a second termination controller for performing a logic operation one the fourth switching driving switching driving signal and a second chip driving control signal; and
a fourth termination switching unit, switched by control of the second termination controller, for selectively supplying a ground voltage.

15. The device according to claim 14, wherein the termination resistance regulator further comprises:
a third termination resistor, located between the third termination switching unit and a supply node of the input signal, for controlling a transmission characteristic of the input signal; and
a fourth termination resistor, located between the fourth termination switching unit and a supply node of the input signal, for controlling a transmission characteristic of the input signal.

16. The device according to claim 1, wherein the nonvolatile ferroelectric mode register comprises:
a program command processor for sequentially outputting a plurality of multiple command signals to code a program command in response to a write enable signal, a row address strobe signal, a column address strobe signal and a reset signal;
a program register controller for performing a logic operation on the plurality of multiple command signals and a power-up detecting signal, and outputting a write control signal and a cell plate signal;
a program register array, comprising the nonvolatile ferroelectric capacitor, for outputting the control signal set in the nonvolatile ferroelectric capacitor in response to the write control signal and the cell plate signal; and
a reset circuit unit for outputting the reset signal into the program register controller in a power-up mode.

17. A semiconductor memory device comprising:
an address latch for latching an inputted address, and outputting a bank selecting signal, a row address and a column address sequentially;
a nonvolatile ferroelectric mode register for programming parameters on a chip operation in a nonvolatile ferroelectric capacitor, and outputting a control signal to control a synchronization operation of a cell array depending on the programmed code; and
a bank array, comprising a plurality of cell arrays, for controlling read/write operations of one cell array synchronously with respect to the control signal in response to the bank selecting signal, the row address and the column address.

18. The device according to claim 17, wherein the logic level of the address is a low voltage transistortransistor logic level.

19. The device according to claim 17, wherein the address latch comprises:
a column address latch for latching the address, and outputting the column address when a column address strobe signal is activated;
a row address latch for latching the address, and outputting the row address when a row address strobe signal is activated; and
a bank selector for latching the address, and outputting the bank selecting signal and the bank address when the row address strobe signal is activated.

20. The device according to claim 17, further comprising a switching controller for selectively switching an output path of the address depending on the programmed code in the nonvolatile ferroelectric capacitor, and for sequentially and time-divisionary controlling the bank address, the row address and the column address.

21. The device according to claim 20, wherein the switching controller comprises:
a first switching controller for selectively controlling output paths of the column address and the row address in response to a first switching control signal generated by a programmed code in a first nonvolatile ferroelectric capacitor; and
a second switching controller for selectively controlling output paths of the row address and the bank address in response to a second switching control signal generated by a programmed code in a second nonvolatile ferroelectric capacitor.

22. The device according to claim 21, wherein the first switching controller comprises:
a first controller, comprising the first nonvolatile ferroelectric capacitor, for generating the first switching control signal;
a first switching unit for selecting an output path of the column address when the first switching control signal is activated; and
a second switching unit for selecting an output path of the row address when the first switching control signal is inactivated.

23. The device according to claim 21, wherein the second switching controller comprises:
a second controller, comprising the second nonvolatile ferroelectric capacitor, for generating the second switching control signal;
a third switching unit for selecting an output path of the bank address when the second switching control signal is activated; and
a fourth switching unit for selecting an output path of the row address when the second switching control signal is inactivated.

24. The device according to claim 17, comprising:
an address transition detector for detecting transitions of the row address and the bank address, and for activating an address transition detecting signal when at least one of addresses transits;

a column burst counter for counting the column address synchronously with respect to the control signal in a burst mode;

a control signal generator for selectively generating driving control signals necessary for the chip operation depending on control of the nonvolatile ferroelectric mode register; and a data input/output buffer for controlling data input/output with the cell array.

25. The device according to claim 17, further comprising a termination resistance regulator, located between the address latch and an input pin, for selectively controlling a termination resistance of an input signal inputted through the input pin depending on a programmed code in a nonvolatile ferroelectric capacitor.

26. The device according to claim 25, wherein the termination resistance regulator comprises:

a first nonvolatile ferroelectric register for selectively outputting a first switching driving signal and a second switching driving signal to control the termination resistance depending on data set in the nonvolatile ferroelectric capacitor;

a first termination switching unit, switched in response to the first switching driving signal, for selectively outputting a termination voltage; and a second termination switching unit, switched in response to the second switching driving signal, for selectively supplying a ground voltage.

27. The device according to claim 26, wherein the termination resistance regulator further comprises:

a first termination resistor, located between the first termination switching unit and a supply node of the input signal, for controlling a transmission characteristic of the input signal of the input signal; and a second termination resistor, located between the second termination switching unit and a supply node of the input signal, for controlling a transmission characteristic of the input signal.

28. The device according to claim 25, wherein the termination resistance regulator comprises:

a second nonvolatile ferroelectric register for selectively outputting a third switching driving signal and a fourth switching driving signal to control the termination resistance depending on data set in the nonvolatile ferroelectric capacitor;

a first termination controller for performing a logic operation on the third switching driving signal and a first chip driving control signal;

a third termination switching unit, switched by control of the first termination controller, for selectively supplying a termination voltage;

a second termination controller for performing a logic operation on the fourth switching driving signal and a second chip driving control signal; and a fourth termination switching unit, switched by control of the second termination controller, for selectively supplying a ground voltage.

29. The device according to claim 28, wherein the termination resistance regulator further comprises:

a third termination resistor, located between the third termination switching unit and a supply node of the input signal, for controlling a transmission characteristic of the input signal; and a fourth termination resistor, located between the fourth termination switching unit and a supply node of the input signal, for controlling a transmission characteristic of the input signal.

30. The device according to claim 17, wherein the nonvolatile ferroelectric mode register comprises:

a program command processor for sequentially outputting a plurality of multiple command signals to code a program command in response to a write enable signal, a row address strobe signal, a column address strobe signal and a reset signal;

a program register controller for performing a logic operation on the plurality of multiple command signal and a power-up detecting signal, and outputting a write control signal and a cell plate signal;

a program register array, comprising the nonvolatile ferroelectric capacitor, for outputting the control signal set in the nonvolatile ferroelectric capacitor in response to the write control signal and the cell plate signal; and a reset circuit unit for outputting the reset signal into the program register controller in a power-up mode.

31. A semiconductor memory device comprising:

a nonvolatile ferroelectric mode register, comprising a nonvolatile ferroelectric memory, for outputting a control signal to control a synchronization operation of a cell array depending on a programmed mode register value in the nonvolatile ferroelectric memory; and a bank array, comprising a plurality of cell arrays, for performing read/write operations of the selected cell array synchronously with respect to the control signal.

* * * * *